(12) United States Patent
Otake

(10) Patent No.: US 11,302,690 B2
(45) Date of Patent: Apr. 12, 2022

(54) NITRIDE SEMICONDUCTOR DEVICE

(71) Applicant: ROHM Co., Ltd., Kyoto (JP)

(72) Inventor: Hirotaka Otake, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 16/879,053

(22) Filed: May 20, 2020

(65) Prior Publication Data

US 2020/0381422 A1 Dec. 3, 2020

(30) Foreign Application Priority Data

May 30, 2019 (JP) .............................. JP2019-101659

(51) Int. Cl.
*H01L 29/778* (2006.01)
*H01L 27/085* (2006.01)
(Continued)

(52) U.S. Cl.
CPC ........ *H01L 27/085* (2013.01); *H01L 21/7605* (2013.01); *H01L 21/8252* (2013.01);
(Continued)

(58) Field of Classification Search
CPC ............. H01L 29/7786; H01L 29/7787; H01L 29/7781–7785; H01L 29/66462;
(Continued)

(56) References Cited

U.S. PATENT DOCUMENTS

2005/0145851 A1* 7/2005 Johnson ............ H01L 29/66462
257/76
2007/0200134 A1* 8/2007 Therrien ................ H01L 23/481
257/103
(Continued)

FOREIGN PATENT DOCUMENTS

JP 2017073506 A 4/2017

OTHER PUBLICATIONS

Li, X. "200 V Enhancement-Mode p-GaN HEMTs Fabricated on 200 mm GaN-on-SOI With Trench Isolation for Monolithic Integration" IEEE Elec. Dev. Lett. vol. 38 No. 7 Jul. 2017 pp. 918-921 (Year: 2017).*

*Primary Examiner* — Grant S Withers
(74) *Attorney, Agent, or Firm* — Hamre, Schumann, Mueller & Larson, P.C.

(57) ABSTRACT

The present invention provides a nitride semiconductor device capable of forming a half-bridge circuit and suppressing changes in current collapse characteristics.
A first transistor of the present invention includes a first nitride semiconductor layer, and a first gate electrode, a first source electrode and a first drain electrode formed thereon. The second transistor includes a second nitride semiconductor layer, and a second gate electrode, a second source electrode and a second drain electrode formed thereon. The source electrode is electrically connected to a lower region of a first region on the substrate, the second source electrode is electrically connected to a lower region of a second region on the substrate, and a first insulating region is disposed between a portion corresponding to the first region on the substrate and a portion corresponding to the second region on the substrate.

20 Claims, 20 Drawing Sheets

(51) Int. Cl.
  *H01L 29/06*      (2006.01)
  *H01L 29/20*      (2006.01)
  *H01L 21/8252*   (2006.01)
  *H01L 29/66*      (2006.01)
  *H01L 21/76*      (2006.01)
  *H01L 29/205*    (2006.01)

(52) U.S. Cl.
  CPC ...... *H01L 29/0653* (2013.01); *H01L 29/2003* (2013.01); *H01L 29/205* (2013.01); *H01L 29/66462* (2013.01); *H01L 29/7786* (2013.01); *H01L 29/7787* (2013.01)

(58) Field of Classification Search
  CPC ............... H01L 27/085; H01L 21/7605; H01L 21/76205; H01L 21/76224; H01L 21/76232; H01L 21/76235; H01L 21/8252; H01L 21/845; H01L 29/0653; H01L 21/0649; H01L 21/7621
  See application file for complete search history.

(56) References Cited

U.S. PATENT DOCUMENTS

| | | | |
|---|---|---|---|
| 2010/0140665 A1* | 6/2010 | Singbal | H01L 23/4824 257/204 |
| 2012/0153300 A1* | 6/2012 | Lidow | H01L 21/743 257/77 |
| 2013/0043485 A1* | 2/2013 | Ueno | H01L 29/1029 257/76 |
| 2014/0203288 A1* | 7/2014 | Hsiung | H01L 29/518 257/76 |
| 2014/0264379 A1* | 9/2014 | Kub | H01L 29/66477 257/77 |
| 2017/0222031 A1* | 8/2017 | Lin | H01L 29/475 |
| 2018/0033682 A1* | 2/2018 | Chern | H01L 29/66462 |
| 2019/0267467 A1* | 8/2019 | Yoshimochi | H01L 21/823878 |

* cited by examiner

NITRIDE SEMICONDUCTOR DEVICE

BACKGROUND OF THE INVENTION

Field of the Invention

The present invention relates to a nitride semiconductor device including a group III nitride semiconductor (to be sometimes referred to as "nitride semiconductor" for short hereinafter).

Description of the Prior Art

A so-called group III nitride semiconductor refers to a semiconductor using nitride as a group V element in a group III-V semiconductor. Representative examples of the above include aluminum nitride (AlN), gallium nitride (GaN) and indium nitride (InN). In general, an expression below may be used: $Al_xIn_yGa_{1-x-y}N$ (where $0 \leq x \leq 1$, $0 \leq y \leq 1$, $0 \leq x+y \leq 1$).

The industry has proposed HEMT (high electron mobility transistor) using such nitride semiconductor. The HEMT includes, for example, an electron transport layer made of GaN, and an electron supply layer extending outward and growing on the electron transport layer and made of AlGaN. A pair of source electrode and drain electrode are formed in a manner of being connected to the electron supply layer, and a gate electrode is disposed between the two.

Due to polarization caused by lattice mismatch between GaN and AlGaN, 2-dimensional electron gas is formed in the electron transport layer, on a position several Å from an inner side of an interface between the electron transport layer and the electron supply layer. The 2-dimensional electron gas is used as a trench to connect the source and the drain. If the 2-dimensional electron gas is cut off by applying a control voltage to the gate electrode, the connection between the source and the drain is also cut off. When the control voltage is not applied to the gate electrode, the source and the drain are connected, and thus the transistor becomes a normally on device.

A device using a nitride semiconductor features high withstand voltage, high temperature operation, large current density, fast switching and low on-resistance. Thus, patent document 1 proposes an application in a power device, and the device of said concept is produced in mass and well-circulated in market.

Patent document 1 discloses the following configuration: a ridge-shaped p-type GaN gate layer (a nitride semiconductor gate layer) is laminated on an AlGaN electron supply layer, and a gate electrode is disposed thereon. The trench is eliminated by a depletion layer extending from the p-type GaN gate layer, hence achieving normally off.

PRIOR ART DOCUMENT

[Patent Publication]
[Patent document 1] Japan Patent Publication No. 2017-73506

SUMMARY OF THE INVENTION

Problems to be Solved by the Invention

Since a GaN HEMT is a lateral device, it is considered to be suitable for making a half-bridge structure by single-chip integration. However, a GaN HEMT is susceptible to changes in current collapse characteristics due to changes in potential of a Si substrate. Thus, it is considered to electrically connect the Si substrate to a source electrode, so as to keep the potential of the Si substrate unchanged.

However, in a half-bridge structure formed by single-chip integration, if the Si substrate is electrically connected to the source electrode, the following issue is incurred: changes in current collapse characteristics or a gate threshold are changed because of mismatch between the source potential of the HEMT on the high side and the potential of the substrate.

It is an object of the present invention to provide a nitride semiconductor device capable for forming a half-bridge circuit and suppressing changes in current collapse characteristics or a gate threshold.

Technical Means for Solving the Problem

A nitride semiconductor device is provided according to an embodiment of the present invention. The nitride semiconductor device includes: a substrate including a first surface and a second surface, a first lateral transistor formed in a first region on the first surface of the substrate, and a second lateral transistor formed in a second region on the first surface of the substrate. The first lateral transistor includes a first nitride semiconductor layer formed on the substrate, and a first gate electrode, a first source electrode and a first drain electrode formed on the first nitride semiconductor layer. The second lateral transistor includes a second nitride semiconductor layer, and a second gate electrode, a second source electrode and a second drain electrode formed on the second nitride semiconductor layer. The first source electrode is electrically connected to a lower region of the first region on the substrate. The second source electrode is electrically connected to a lower region of the second region on the substrate. A first insulating region is disposed between a portion corresponding to the first region on the substrate and a portion corresponding to the second region on the substrate.

The configuration may provide a nitride semiconductor device capable of forming a half-bridge circuit and suppressing changes in current collapse characteristics and a gate threshold.

In one embodiment of the present invention, the first insulating region includes: a first separation trench, located in a region between the first region and the second region in a top view, formed by excavating from the first surface toward the second surface of the substrate; a second separation trench, located in a region between the first region and the second region in a top view, formed by excavating from the second surface toward the first surface of the substrate, and distanced from a bottom surface of the first separation trench; and an insulative region, formed in a region including a portion between the first separation trench and the second separation trench in the substrate.

In one embodiment of the present invention, the first insulating region further includes: a first insulator, embedded in the first separation trench; and a second insulator, embedded in the second separation trench.

In one embodiment of the present invention, the first nitride semiconductor layer and the second nitride semiconductor layer are insulated by a second insulating region formed therebetween.

In one embodiment of the present invention, the second insulating region includes a third separation trench. The third separation trench is formed in a region between the first nitride semiconductor layer and the second nitride semiconductor layer.

In one embodiment of the present invention, the second insulating region further includes a third insulator. The third insulator is embedded in the third separation trench.

In one embodiment of the present invention, each of the first nitride semiconductor layer and the second nitride semiconductor layer includes: an electron transport layer, formed on the substrate, made of a nitride semiconductor; an electron supply layer, formed on the electron transport layer, made of a nitride semiconductor having a band gap larger than that of the nitride semiconductor forming the electron transport layer; and a semiconductor gate layer, formed on a portion of the surface of the electron supply layer, made of a nitride semiconductor including an acceptor impurity. The first source electrode and the first drain electrode are formed on the electron supply layer of the first nitride semiconductor layer, and the first gate electrode is formed on the semiconductor gate layer of the first nitride semiconductor layer. The second source electrode and the second drain electrode are formed on the electron supply layer of the second nitride semiconductor layer, and the second gate electrode is formed on the semiconductor gate layer of the second nitride semiconductor layer.

In one embodiment of the present invention, the first lateral transistor includes a first driver source electrode formed on a surface side of the first nitride semiconductor layer, and the second lateral transistor includes a second driver source electrode formed on a surface side of the second nitride semiconductor layer.

In one embodiment of the present invention, the substrate is an insulating substrate or a semi-insulating substrate, and a seed layer is formed between the substrate and the first nitride semiconductor layer and between the substrate and the second nitride semiconductor layer.

DETAILED DESCRIPTION OF THE EMBODIMENTS

Details of the present invention are described in preferred embodiments with the accompanying drawings below.

Figure 1:
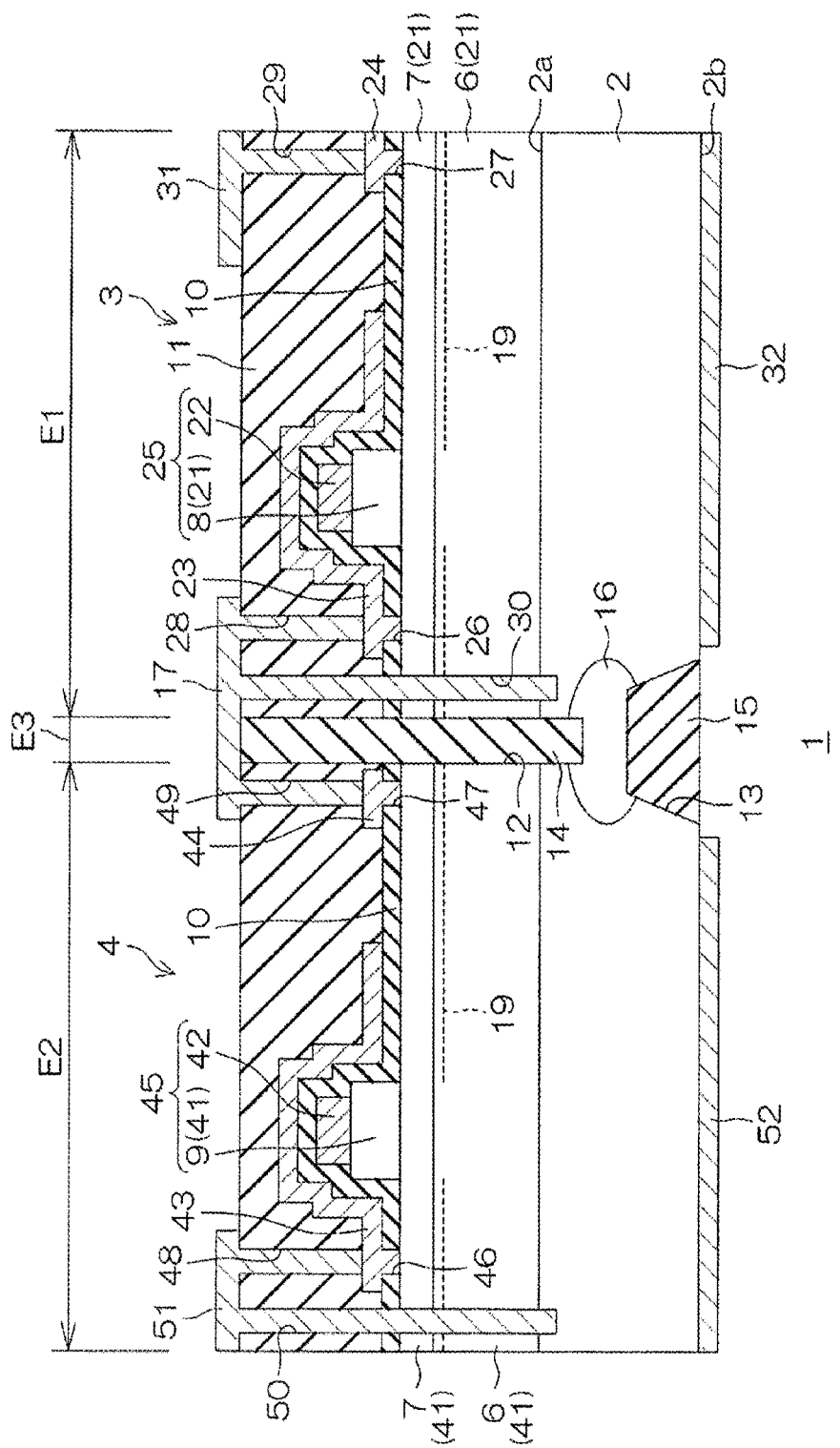
FIG. 1 is a cross-sectional diagram of a configuration of a nitride semiconductor device according to a first embodiment of the present invention.

FIG. 1 shows a cross-sectional diagram of a configuration of a nitride semiconductor device according to a first embodiment of the present invention.

A nitride semiconductor device 1 includes: a substrate 2 including a first surface 2a and a second surface 2b, a first lateral transistor 3 formed in a first region E1 on the first surface 2a of the substrate 2, and a second lateral transistor 4 formed in a second region E2 on the first surface 2a of the substrate 2. The first region E1 and the second region E2 are spaced by a separation region E3 and are arranged in an adjacent manner.

In the description below, the first lateral transistor 3 is referred to as "first transistor 3" and the second lateral transistor 4 is referred to as "second transistor 4".

As to be described below, the nitride semiconductor device 1 is configured to form a single-chip integrated circuit of a half-bridge circuit. The first transistor 3 forms a high-side switching element of the half-bridge circuit, and the second transistor 4 forms a low-side switching element of the half-bridge circuit.

The first transistor 3 includes a first nitride semiconductor layer 21 formed on the first surface 2a of the substrate 2, and a first gate electrode 22, a first source electrode 23 and a first drain electrode 24 formed on the first nitride semiconductor layer 21.

The first nitride semiconductor layer 21 includes, in the first region E1, an electron transport layer 6 formed on the substrate 2, an electron supply layer 7 formed on the electron transport layer 6, and a ridge-shaped first semiconductor gate layer 8 formed on a portion of the surface of the electron supply layer 7.

The first gate electrode 22 is formed on a widthwise middle portion excluding two side portions of the first semiconductor gate layer 8. The first semiconductor gate layer 8 and the first gate electrode 22 constitute a first gate portion 25.

In the first region E1, a passivation layer 10 is formed on the electron supply layer 7, wherein the passivation layer 10 covers an exposed surface of the electron supply layer 7 and the first gate portion 25. In the passivation layer 10, a first source contact hole 26 is formed in a region between the separation region E3 and the first gate portion 25. Furthermore, in the passivation layer 10, a first drain contact hole 27 is formed on one side opposite to the first source contact hole 26 with respect to the first gate portion 25.

In the first region E1, the first source electrode 23 is formed on the passivation layer 10 in a manner of covering the first source contact hole 26. The first source electrode 23 passes through the first source contact hole 26 and is thus in contact with the electron supply layer 7. The first source electrode 23 covers the first gate portion 25. Furthermore, on the passivation layer 10, the first drain electrode 24 is formed in a manner of covering the first drain contact hole 27. The first drain electrode 24 passes through the first drain contact hole 27 and is thus in contact with the electron supply layer 7.

The second transistor 4 includes a second nitride semiconductor layer 41 formed on the first surface 2a of the substrate 2, and a second gate electrode 42, a second source electrode 43 and a second drain electrode 44 formed on the second nitride semiconductor layer 41.

The second nitride semiconductor layer 41 includes, in the second region E2, the electron transport layer 6 formed on the substrate 2, the electron supply layer 7 formed on the electron transport layer 6, and a ridge-shaped second semiconductor gate layer 9 formed on a portion of the surface of the electron supply layer 7.

The second gate electrode 42 is formed on a widthwise middle portion excluding two side portions of the second semiconductor gate layer 9. The second semiconductor gate layer 9 and the second gate electrode 42 constitute a second gate portion 45.

In the second region E2, the passivation layer 10 is formed on the electron supply layer 7, wherein the passivation layer 10 covers the exposed surface of the electron supply layer 7 and the second gate portion 45. In the passivation layer 10, a second drain contact hole 47 is formed in a region between the second gate portion 45 and the separation region E3. Furthermore, in the passivation layer 10, a second source contact hole 46 is formed on one side opposite to the second drain contact hole 47 with respect to the second gate portion 45.

In the second region E2, the second source electrode 43 is formed on the passivation layer 10 in a manner of covering the second source contact hole 46. The second source electrode 43 passes through the second source contact hole 46 and is thus in contact with the electron supply layer 7. The second source electrode 43 covers the second gate portion 45. Furthermore, on the passivation layer 10, the second drain electrode 44 is formed in a manner of covering the second drain contact hole 47. The second drain electrode 44 passes through the second drain contact hole 47 and is thus in contact with the electron supply layer 7.

On the passivation layer 10, an interlayer insulating layer 11 is formed in a manner of covering the first source electrode 23, the first drain electrode 24, the second source electrode 43, and the second drain electrode 44.

In the separation region E3, an upper-side separation trench 12 is formed at the interlayer insulating layer 11, the passivation layer 10, the electron supply layer 7, the electron transport layer 6 and the substrate 2, wherein the upper-side separation trench 12 passes through the interlayer insulating layer 11, the passivation layer 10, the electron supply layer 7 and the electron transport layer 6 and reaches the inner of the substrate 2. A portion of the upper-side separation trench 12 formed at the substrate 2 is equivalent to the "first separation trench" of the present invention. A portion of the upper-side separation trench 12 formed at the electron supply layer 7 and the electron transport layer 6 is equivalent to the "third separation trench" of the present invention.

Furthermore, in the substrate 2, a lower-side separation trench 13 is formed in the separation region E3 and neighboring regions on two sides thereof, wherein the lower-side separation trench 13 is formed by excavating from the second surface 2b toward the first surface 2a of the substrate 2 and is yet distanced from the bottom surface of the upper-side separation trench 12. The lower-side separation trench 13 is equivalent to the "second separation trench" of the present invention.

An upper-side insulator 14 is embedded in the upper-side separation trench 12, and a lower-side insulator 15 is embedded in the lower-side separation trench 13.

An insulative region 16 is formed in a region including a portion between the lower-side separation trench 13 and the upper-side separation trench 12 in the substrate 2. When the substrate 2 is, for example, a silicon substrate, the insulative region 16 may also be formed by thermal oxidation of silicon in the region.

In the description below, an insulating region consisting a portion of the upper-side separation trench 12 formed in the substrate 2, the upper-side insulator 14 embedded in the portion, the lower-side separation trench 13, the lower-side insulator 15 embedded in the lower-side separation trench 13, and the insulative region 16 is sometimes referred to as the "first insulating region". Furthermore, an insulating region consisting of a portion of the upper-side separation trench 12 formed at the electron supply layer 7 and the electron transport layer 6, and the upper-side insulator 14 embedded in the portion is referred to as the "second insulating region".

By the first insulating regions 12, 13, 14, 15 and 16, a portion corresponding to the first region E1 on the substrate 2 is insulated and separated from a portion corresponding to the second region E2 on the substrate 2. A portion corresponding to the first region E1 on the substrate 2 is equivalent to the substrate of the first transistor 3, and a portion corresponding to the second region E2 on the substrate 2 is equivalent to the substrate of the second transistor 4. In the embodiment, the first insulating regions are equivalent to the "first insulating region" of the present invention.

In addition, by the second insulating regions 12 and 14, the first nitride semiconductor layer 21 is insulated and separated from the second nitride semiconductor layer 41. In the embodiment, the second insulating regions are equivalent to the "second insulating region" of the present invention.

In the first region E1, a first source via hole 28 and a first drain via hole 29 are formed at the interlayer insulating layer 11, wherein the first source via hole 28 passes through the interlayer insulating layer 11 and exposes a portion of the first source electrode 23, and the first drain via hole 29 passes through the interlayer insulating layer 11 and exposes a portion of the first drain electrode 24. The first source via hole 28 is formed right above the first source contact hole 26, and the first drain via hole 29 is formed right above the first drain contact hole 27.

Furthermore, at a position between the separation region E3 and the first source via hole 28, a first source/substrate connecting via hole 30 is formed at the interlayer insulating layer 11, the electron supply layer 7, the electron transport layer 6 and the substrate 2, wherein the first source/substrate connecting via hole 30 passes through the interlayer insulating layer 11, the electron supply layer 7 and the electron transport layer 6 and reaches the inner of the substrate 2.

In the second region E2, a second source via hole 48 and a second drain via hole 49 are formed at the interlayer insulating layer 11, wherein the second source via hole 48 passes through the interlayer insulating layer 11 and exposes a portion of the second source electrode 43, and the second drain via hole 49 passes through the interlayer insulating layer 11 and exposes a portion of the second drain electrode 44. The second source via hole 48 is formed right above the second source contact hole 46, and the second drain via hole 49 is formed right above the second drain contact hole 47.

Furthermore, on one side opposite to the second gate portion 45 with respect to the second source via hole 48, a second source/substrate connecting via hole 50 is formed at the interlayer insulating layer 11, the electron supply layer 7, the electron transport layer 6 and the substrate 2, wherein the second source/substrate connecting via hole 50 passes through the interlayer insulating layer 11, the electron supply layer 7 and the electron transport layer 6 and reaches the inner of the substrate 2.

In the first region E1, a drain wire 31 is formed on the interlayer insulating layer 11 in a manner of covering the first drain via hole 29. The drain wire 31 is also embedded in the first drain via hole 29, and is connected to the first drain electrode 24 in the first drain via hole 29.

In a region including a region in the first region E1 and close to the separation region E3, the separation region E3, and a region in the second region E2 and close to the separation region E3, an inter-component connecting wire 17 is formed on the interlayer insulating layer 11 in a manner of covering the first source via hole 28, the first source/substrate connecting via hole 30 and the second drain via hole 49. The inter-component connecting wire 17 is also embedded in the first source via hole 28, the first source/substrate connecting via hole 30 and the second drain via hole 49.

The inter-component connecting wire 17 is connected to the first source electrode 23 in the first source via hole 28, and is connected to the second drain electrode 44 in the second drain via hole 49. Thus, the first source electrode 23 of the first transistor 3 is connected to the second drain electrode 44 of the second transistor 4 by the inter-component connecting wire 17.

Furthermore, the inter-component connecting wire 17 is connected to a portion corresponding to the first region E1 on the substrate 2 in the first source/substrate connecting via hole 30. Thus, the first source electrode 23 of the first transistor 3 is electrically connected to the substrate 2 of the first transistor 3.

In the second region E2, a source wire 51 is formed on the interlayer insulating layer 11 in a manner of covering the second source via hole 48 and the second source/substrate connecting via hole 50. The source wire 51 is also embedded in the second source via hole 48 and the second source/substrate connecting via hole 50. The source wire 51 is connected to the second source electrode 43 in the second source via hole 48. Furthermore, the source wire 51 is connected to a portion corresponding to the second region E2 on the substrate 2 in the second source/substrate connecting via hole 50. Thus, the second source electrode 43 of the second transistor 4 is electrically connected to the substrate 2 of the second transistor 4.

Furthermore, the via holes are formed as starting from the interlayer insulating layer 11 in an embodiment of the present invention. However, when one or more interlayer insulating layers are further formed on the interlayer insulating layer 11, the via holes may also be formed as starting from surfaces of other interlayer insulating layers on the interlayer insulating layer 11. When one or more interlayer insulating layers are further formed on the interlayer insulating layer 11, a driver source (H/S driver source or L/S driver source) (referring to FIG. 2) to be described below may also be led out from any interlayer insulating layer on the interlayer insulating layer 11.

A first backside electrode 32 is formed on a portion corresponding to the first region E1 on the second surface 2b of the substrate 2. A second backside electrode 52 is formed on a portion corresponding to the second region E2 on the second surface 2b of the substrate 2.

Materials of the components are described more specifically below.

The substrate 2 in this embodiment is a low-resistance silicon substrate. The low-resistance silicon substrate may also be, for example, a p-type substrate having a resistance of 0.001 Ωmm to 0.5 Ωmm (more specifically, approximately 0.01 Ωmm to 0.1 Ωmm). Furthermore, apart from a low-resistance silicon substrate, the substrate 2 may also be a low-resistance SiC substrate, a low-resistance GaN substrate, and so on. The substrate 2 has a thickness of, for example, approximately 650 μm in the semiconductor manufacturing process, and is ground to a thickness of less than 300 μm in a pre-stage of a chip forming process.

The electron transport layer 6 is made of a GaN layer in the embodiment, and has a thickness of approximately 0.5 μm to 2 μm. Furthermore, to suppress leakage current flowing through the electron transport layer 6, an impurity for resulting in semi-insulation thereof may be introduced to parts other than the surface regions. In this case, the concentration of the impurity is preferably more than $4 \times 10^{16}$ cm$^{-3}$. Furthermore, the impurity is, for example, C or Fe.

The electron supply layer 7 is made of a nitride semiconductor having a band gap larger than that of the nitride semiconductor forming the electron transport layer 6. More specifically, the electron supply layer 7 is made of a nitride semiconductor having an Al composition higher than that of the electron transport layer 6. In the nitride semiconductor, the band gap gets larger as the composition of Al increases. In the embodiment, the electron supply layer 7 is made of an $Al_{x1}Ga_{1-x1}N$ layer (where 0<x1<1), and has a thickness of approximately 5 nm to 25 nm.

Thus, the electron transport layer 6 and the electron transport layer 7 are made of nitride semiconductors having different band gaps (Al compositions), such that lattice mismatch between the two is resulted. Furthermore, due to spontaneous polarization of the electron transport layer 6 and the electron supply layer 7, as well as piezoelectric polarization caused by the lattice mismatch between the two, the energy level of the conduction band of the electron transport layer 6 in the interface between the electron transport layer 6 and the electron supply layer 7 is lower than the Fermi level.

Accordingly, in each of the first region E1 and the second region E2, a 2-dimensional electron gas (2DEG) 19 expands at a position (for example, at a distance of several Å from the interface) in the electron transport layer 6 that is close to the interface between the electron transport layer 6 and the electron supply layer 7. Furthermore, because of the upper-side separation trench 12 formed in the separation region E3 between the first region E1 and the second region E2, the 2-dimensional electron gas 19 formed in the two regions E1 and E2 is segmented by the upper-side separation trench 12.

The first semiconductor gate layer 8 and the second semiconductor gate layer 9 are made of nitride semiconductors doped with an acceptor impurity. In the embodiment, each of the semiconductor gate layers 8 and 9 is made of a GaN layer (p-type GaN layer) doped with an acceptor impurity. Each of the semiconductor gate layers 8 and 9 has a thickness of preferably 40 nm to 150 nm.

The concentration of the acceptor impurity injected into each of the semiconductor gate layers 8 and 9 is preferably more than $1 \times 10^{19}$ cm$^{-3}$. In the embodiment, the acceptor impurity is magnesium (Mg). The acceptor impurity may also be an acceptor impurity other than Mg, such as zinc (Zn). The first semiconductor gate layer 8 and the second semiconductor gate layer 9 are respectively provided for the purpose of eliminating the 2-dimensional electron gas 19 generated near the interface between the electron transport layer 6 and the electron supply layer 7, from right below the first gate portion 25 and the second gate portion 45 in the first region E1 and the second region E2 in a normal condition when no voltage is applied.

The first gate electrode 22 and the second gate electrode 42 in the embodiment include TiN. Each of the gate electrodes 22 and 42 has a layer thickness of approximately 50 nm to 200 nm.

The passivation layer 10 in the embodiment is made of a SiN layer, and has a thickness of approximately 50 nm to 200 nm. The passivation layer 10 may be made of any single layer of SiN, SiO$_2$ and SiON, or a composite layer formed by any combination of two or more thereof.

The first source electrode 23, the second source electrode 43, the first drain electrode 24 and the second drain electrode 44 include, for example, a first metal layer (an ohmic metal layer) connected to the electron supply layer 7, a second metal layer (a main electrode metal layer) laminated on the first metal layer, a third metal layer (a sealing layer) laminated on the second metal layer, and a fourth metal layer (a barrier metal layer) laminated on the third metal layer. The first metal layer is, for example, a Ti layer having a thickness of approximately 10 nm to 20 nm. The second metal layer is, for example, an Al-containing layer having a thickness of approximately 100 nm to 300 nm. The third metal layer is, for example, a Ti layer having a thickness of approximately 10 nm to 20 nm. The fourth metal layer is, for example, a TiN layer having a thickness of approximately 10 nm to 50 nm.

The first backside electrode 32 and the second backside electrode 52 include, for example, Ni, Ag, Ti, and Au. The interlayer insulating layer 11 in the embodiment includes SiO$_2$, and has a layer thickness of approximately 0.5 μm to 1.5 μm. The inter-component connecting wire 17, the drain wire 31 and the source wire 51 include, for example, Al.

The upper-side insulator 14 and the lower-side insulator 15 in the embodiment include SiO$_2$. The upper-side insulator 14 and the lower-side insulator 15 may be made of any one of SiN, SiO$_2$ and SiON, or any combination of two or more thereof.

In regard to the nitride semiconductor device 1, in each of the first region E1 and the second region E2, a heterojunction is formed as the electron supply layer 7 having a different band gap (Al composition) is formed on the electron transport layer 6. Accordingly, in each of the first region E1 and the second region E2, the 2-dimensional electron gas 19 is formed in the electron transport layer 6 near the interface between the electron supply layer 7 and the electron transport layer 6. Accordingly, in each of the first region E1 and the second region E2, the first transistor 3 and the second transistor 4 including an HEMT using the 2-dimensional electron gas 19 as a trench are formed, respectively.

The first gate electrode 22 faces the electron supply layer 7, with the first semiconductor gate layer 8 spaced in between. Below the first gate electrode 22, the energy levels of the electron transport layer 6 and the electron supply layer 7 are increased by ionized acceptors contained in the first semiconductor gate layer 8 formed by a p-type GaN layer. Thus, the energy level of the conduction band in the heterojunction interface between the electron transport layer 6 and the electron supply layer 7 is higher than the Fermi level. Thus, right below the first gate electrode 22 (the first gate portion 25), the 2-dimensional electron gas 19 caused by spontaneous polarization of the electron transport layer 6 and the electron supply layer 7 and piezoelectric polarization caused by the lattice mismatch between the two is not formed.

Accordingly, in the first region E1, when a bias is not applied (zero bias) to the first gate electrode 22, the trench formed by the 2-dimensional electron gas 19 is cut off right below the first gate electrode 22. Thus, the first transistor 3 formed in the first region E1 becomes a normally off transistor. When an appropriate on voltage (for example, 3 V) is applied to the first gate electrode 22, the trench in the electron transport layer 6 right below the first gate electrode 22 is induced, and the 2-dimensional electron gas 19 on two sides of the first gate electrode 22 is connected. Accordingly, the source and the drain of the first transistor 3 are connected.

Similar to the first transistor 3, for the second transistor 4 formed in the second region E2, when bias is not applied (zero bias) to the second gate electrode 42, the trench formed by the 2-dimensional electron gas 19 is cut off right below the second gate electrode 42. Thus, the second transistor 4 also becomes a normally off transistor. When an appropriate on voltage (for example, 3 V) is applied to the second gate electrode 42, the trench in the electron transport layer 6 right below the second gate electrode 42 is induced, and the 2-dimensional electron gas 19 on two sides of the second gate electrode 42 is connected. Accordingly, the source and the drain of the second transistor 4 are connected.

Figure 2:
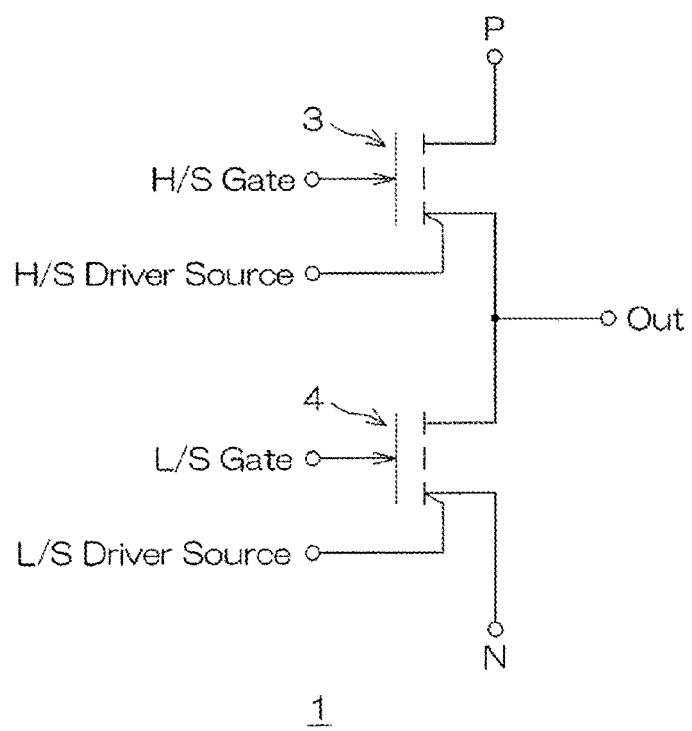
FIG. 2 is a circuit diagram of an electrical configuration of the nitride semiconductor device in FIG. 1.

FIG. 2 shows a circuit diagram of an electrical configuration of the nitride semiconductor device in FIG. 1.

Referring to FIG. 1 and FIG. 2, the first drain electrode 24 of the first transistor 3 is connected to a first power terminal P by the drain wire 31. The first source electrode 23 of the first transistor 3 is connected to a high-side (H/S) driver source and the second drain electrode 44 of the second transistor 4 by the inter-component connecting wire 17. The inter-component connecting wire 17 is also connected to an output terminal Out. The first gate electrode 22 of the first transistor 3 is connected to a high-side (H/S) gate.

The second source electrode 43 of the second transistor 4 is connected to a low-side (L/S) driver source and a second power terminal N by the source wire 51. The second gate electrode 42 of the second transistor 4 is connected to a low-side (L/S) gate.

That is to say, the nitride semiconductor device 1 in FIG. 1 forms a half-bridge circuit.

When in use, the second power terminal N is grounded. A predetermined positive voltage is applied to the first power terminal P. Between the high-side gate and the high-side driver source, an off voltage or an on voltage is applied by using the first source electrode 23 as a reference potential. Between the low-side gate and the low-side driver source, an off voltage or an on voltage is applied by using the second source electrode 43 as a reference potential.

FIG. 3A to FIG. 3L are cross-sectional diagrams for illustrating manufacturing steps of the nitride semiconductor device 1 in FIG. 1, and depict cross-section structures of a plurality of phases in the manufacturing steps.

Figure 3A:
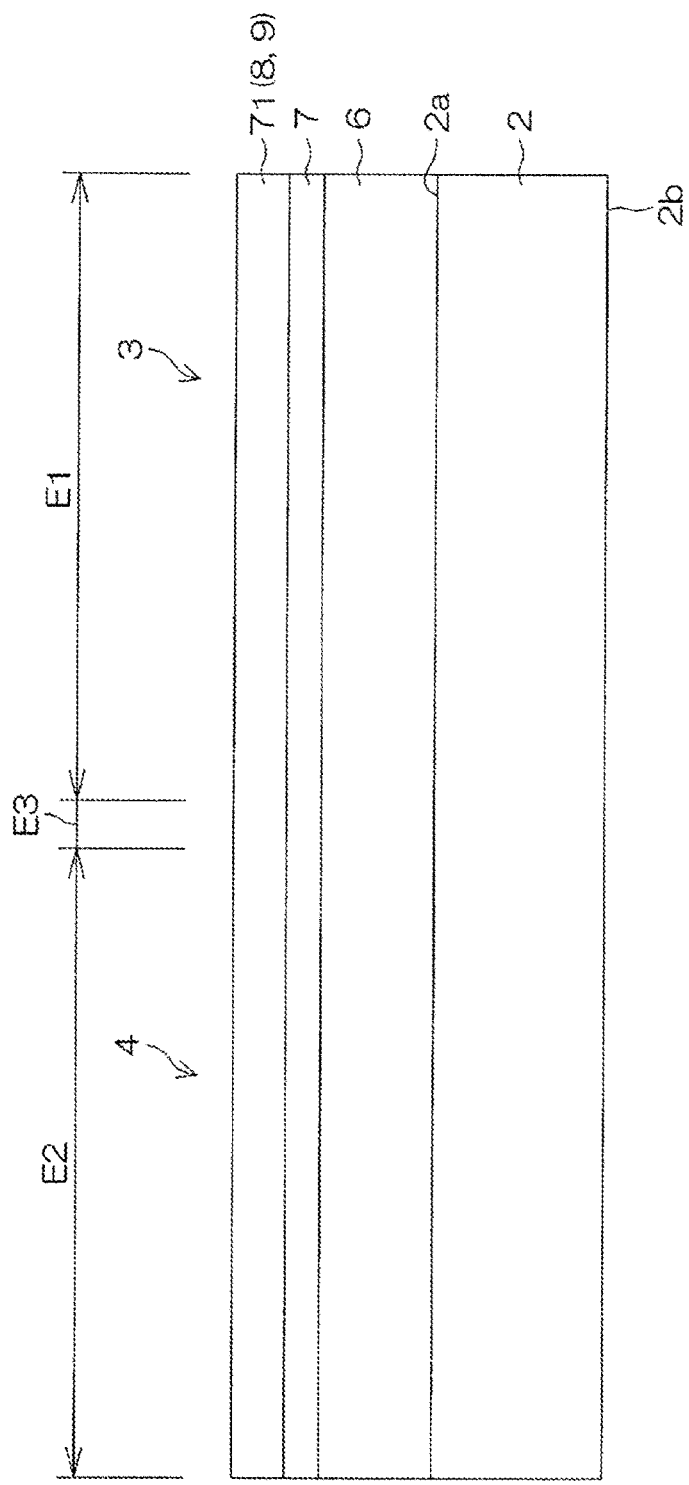
FIG. 3A is a cross-sectional diagram of an example of a manufacturing step of the nitride semiconductor device in FIG. 1.

First, as shown in FIG. 3A, the electron transport layer 6 and the electron supply layer 7 are extended outward and grown on the substrate 2 using MOCVD (metal organic chemical vapor deposition). The surface (the first surface 2*a*) of the substrate 2 includes the first region E1 and the second region E2. Further, a semiconductor gate layer material layer 71 is extended outward and grown on the electron supply layer 7 by MOCVD, wherein the semiconductor gate layer material layer 71 serves as a material layer of the first semiconductor gate layer 8 and the second semiconductor gate layer 9.

Figure 3B:
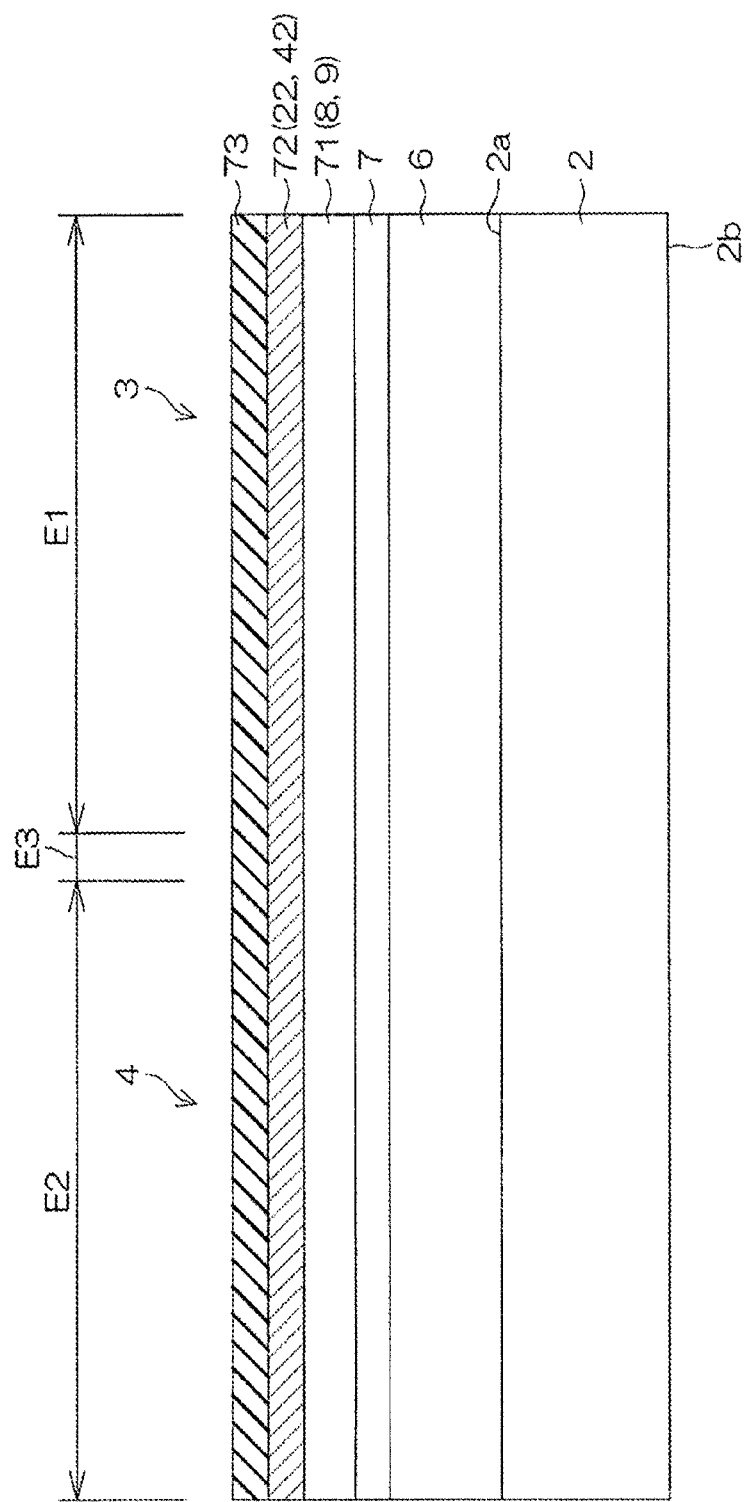
FIG. 3B is cross-sectional diagram of a next step of FIG. 3A.

Then, as shown in FIG. 3B, a gate electrode layer 72 is formed in a manner of covering the entire exposed surface by sputtering, wherein the gate electrode layer 72 serves as a material layer for the first gate electrode 22 and the second gate electrode 42. In addition, a first $SiO_2$ layer 73 is formed on the gate electrode layer 72.

Figure 3C:
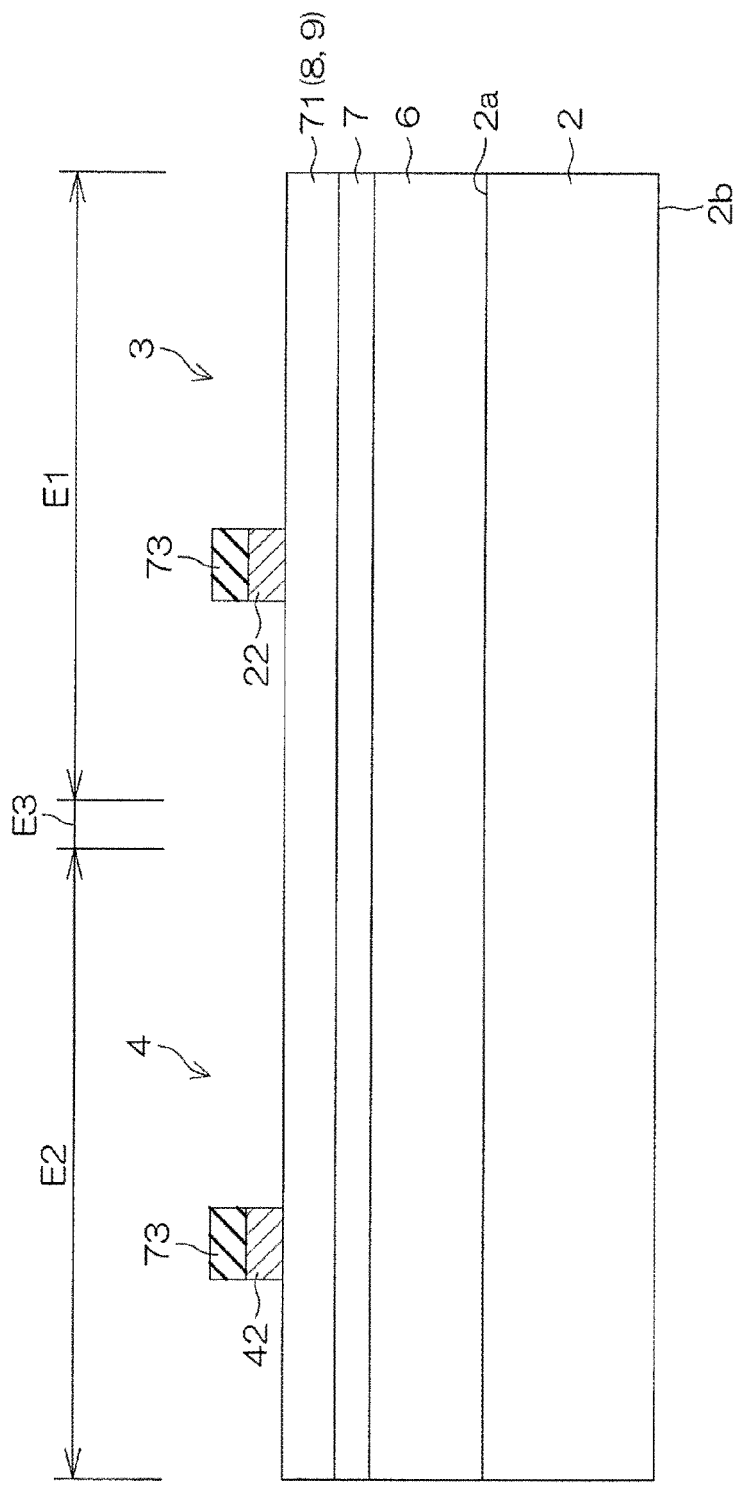
FIG. 3C is a cross-sectional diagram of a next step of FIG. 3B.

Next, as shown in FIG. 3C, the first $SiO_2$ layer 73 on a predetermined first gate electrode preparation region and a predetermined second gate electrode preparation region on the surface of the gate electrode layer 72 is preserved by, for example, dry etching, so as to selectively remove the first $SiO_2$ layer 73. In addition, the gate electrode layer 72 is patterned by dry etching using the first $SiO_2$ layer 73 as a mask. Accordingly, the first gate electrode 22 and the second gate electrode 42 are formed.

Figure 3D:
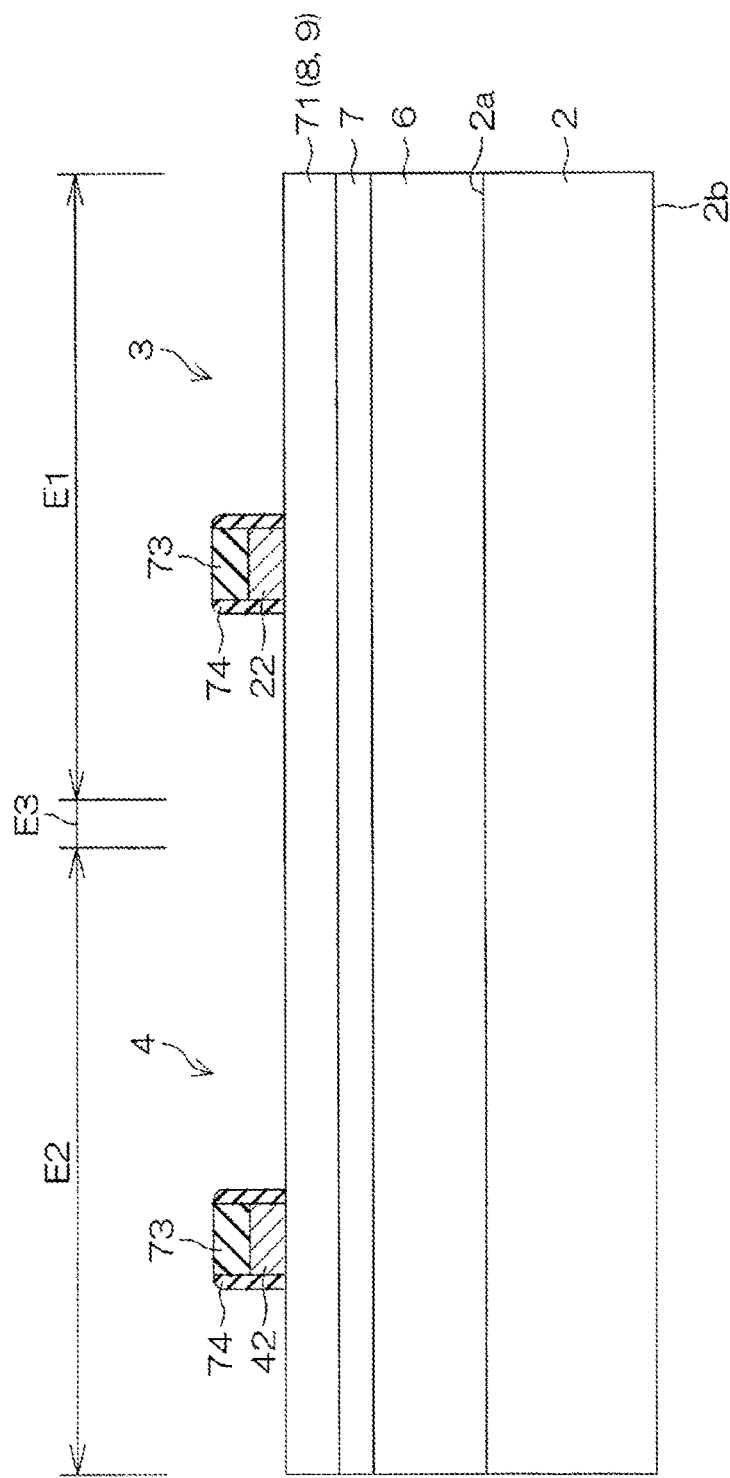
FIG. 3D is a cross-sectional diagram of a next step of FIG. 3C.

Further, as shown in FIG. 3D, a second $SiO_2$ layer 74 is formed in a manner of covering the entire exposed surface by, for example, PECVD (plasma-enhanced chemical vapor deposition). Then, the second $SiO_2$ layer 74 covering the first gate electrode 22 and a side surface of the first $SiO_2$ layer 73 thereon, and the second $SiO_2$ layer 74 covering the second gate electrode 42 and a side surface of the first $SiO_2$ layer 73 thereon are formed by back etching the second $SiO_2$ layer 74.

Figure 3E:
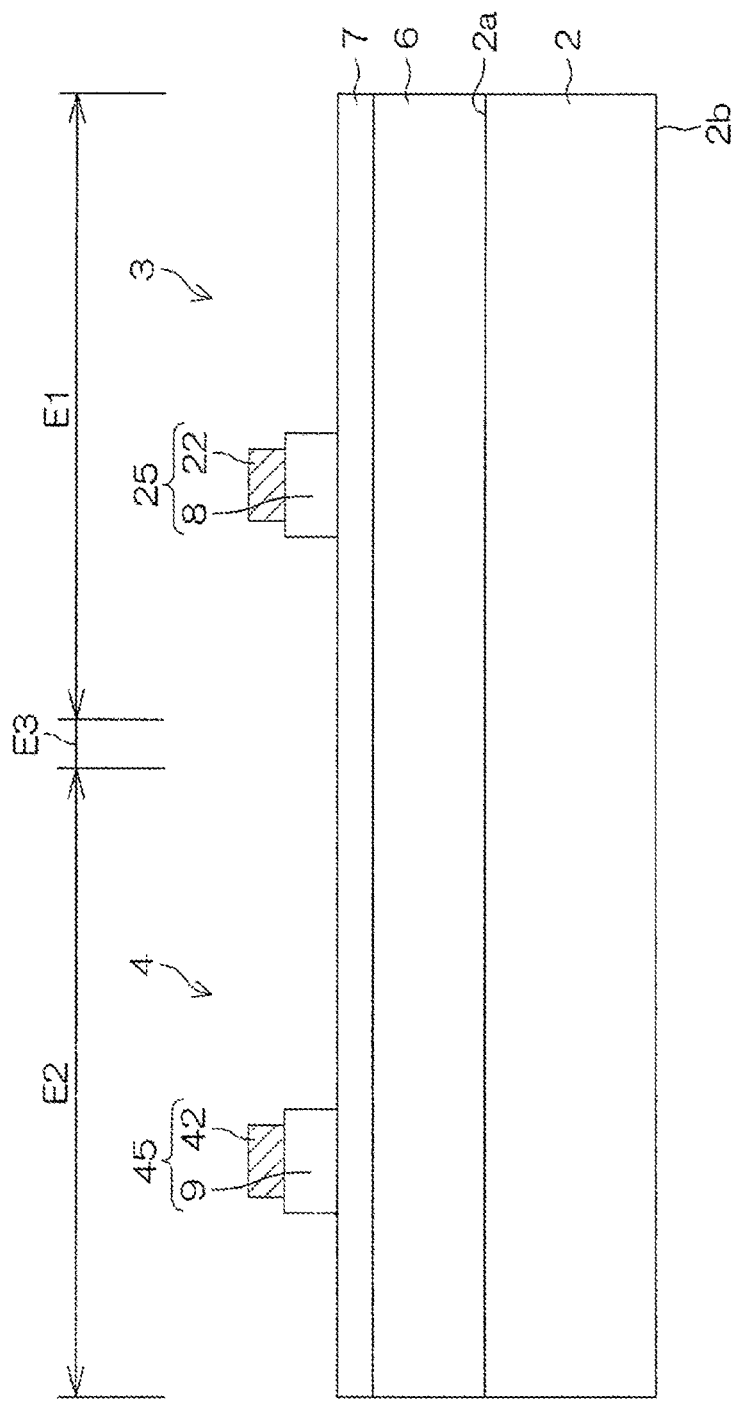
FIG. 3E is a cross-sectional diagram of a next step of FIG. 3D.

Next, as shown in FIG. 3E, the semiconductor gate layer material layer 71 is patterned by dry etching using the first $SiO_2$ layer 73 and the second $SiO_2$ layer 74 covering the upper surface and the side surface of the first gate electrode 22 and the first $SiO_2$ layer 73 and the second $SiO_2$ layer 74 covering the upper surface and the side surface of the second gate electrode 42 as a mask. Then, the first $SiO_2$ layer 73 and the second $SiO_2$ layer 74 are removed by, for example, wet etching.

Accordingly, the ridge-shaped first semiconductor gate layer 8 and second semiconductor gate layer 9 are obtained. Accordingly, in the first region E1, the first gate portion 25 consisting of the first semiconductor gate layer 8 and the first gate electrode 22 formed on the widthwise middle portion of the upper surface thereof is obtained. Furthermore, in the second region E2, the second gate portion 45 consisting of the second semiconductor gate layer 9 and the second gate electrode 42 formed on the widthwise middle portion of the upper surface thereof is obtained.

Figure 3F:
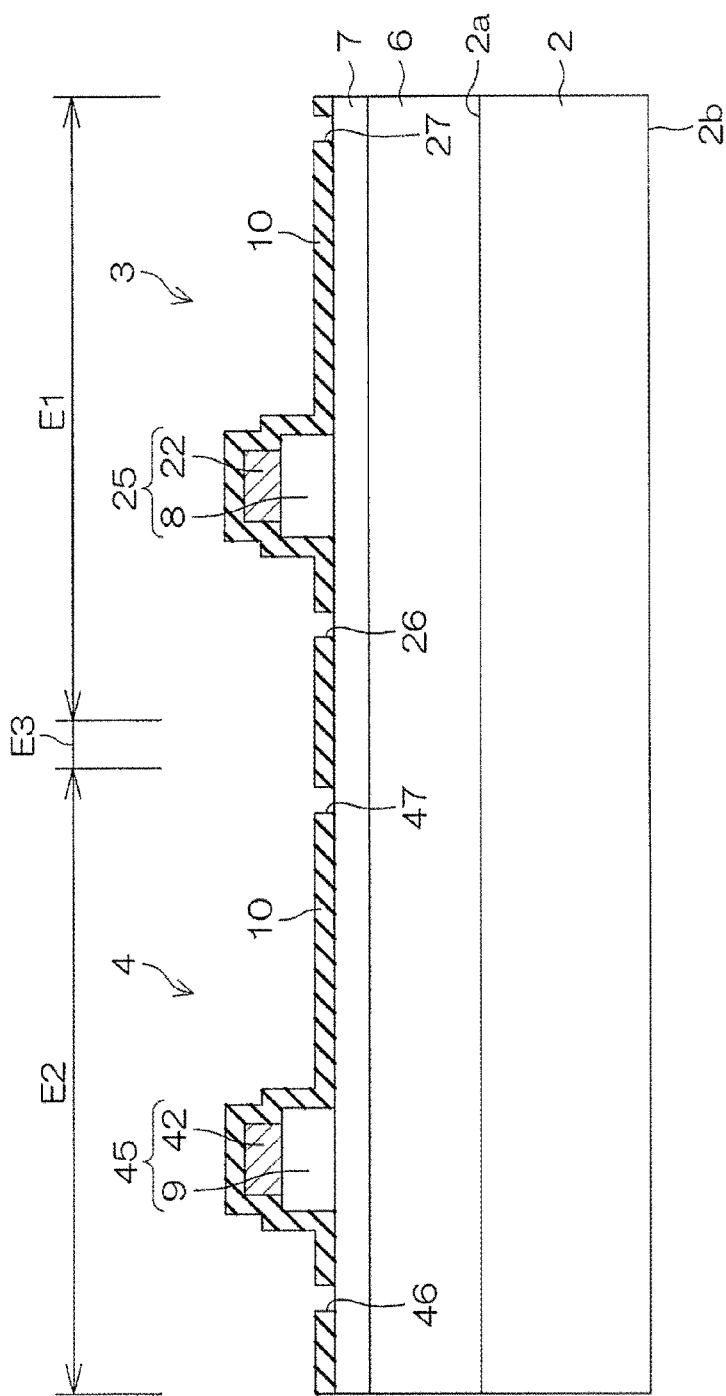
FIG. 3F is a cross-sectional diagram of a next step of FIG. 3E.

Then, as shown in FIG. 3F, the passivation layer 10 is formed in a manner of covering the entire exposed surface. The passivation layer 10 includes, for example, SiN. Moreover, at the passivation layer 10, the first source contact hole 26, the first drain contact hole 27, the second source contact hole 46 and the second drain contact hole 47 reaching the electron supply layer 7 are formed.

Figure 3G:
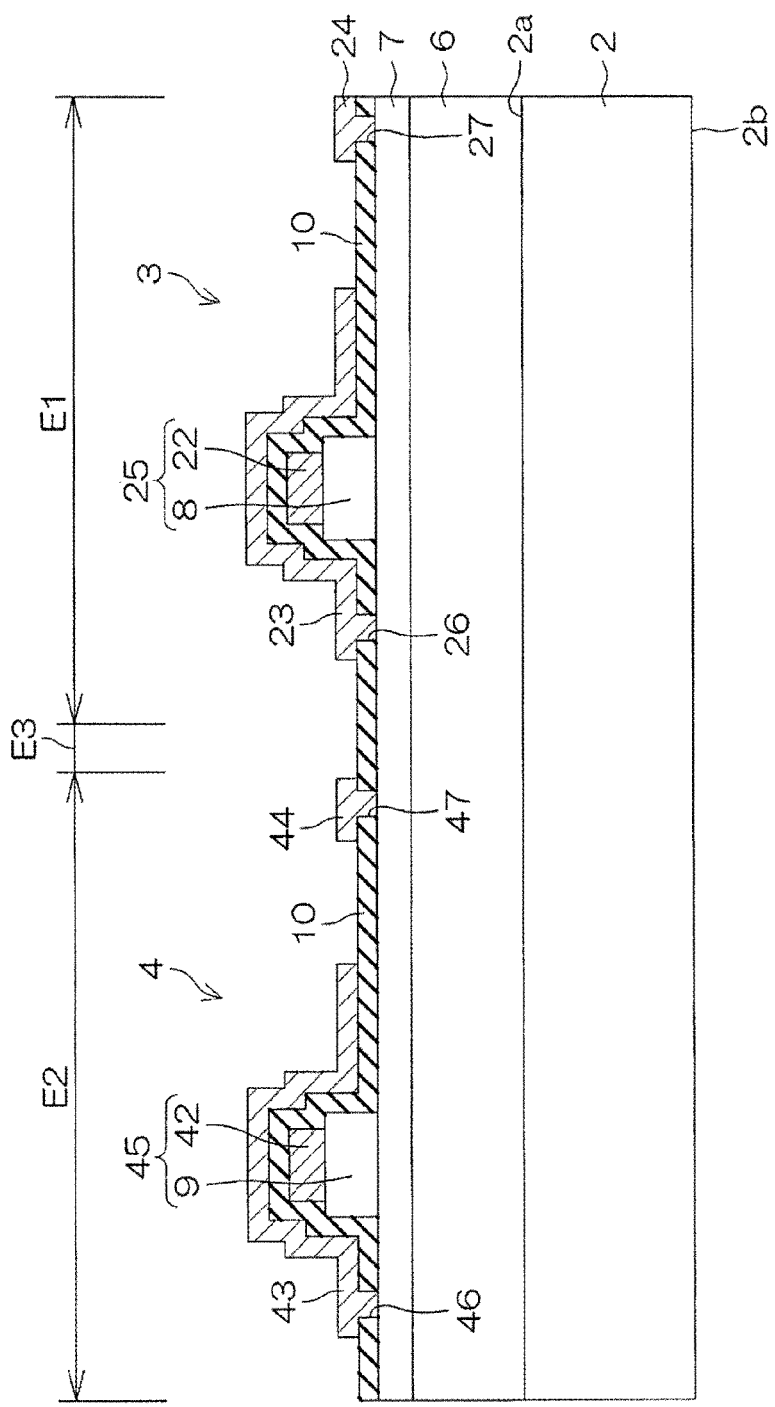
FIG. 3G is a cross-sectional diagram of a next step of FIG. 3F.

Then, as shown in FIG. 3G, a source-drain electrode layer is formed in a manner of covering the entire exposed surface. Next, the source-drain electrode layer is patterned by lithography and etching. Accordingly, in the first region E1, the first source electrode 23 and the first drain electrode 24 in contact with the electron supply layer 7 are formed.

Furthermore, in the second region E2, the second source electrode 43 and the second drain electrode 44 in contact with the electron supply layer 7 are formed.

Figure 3H:
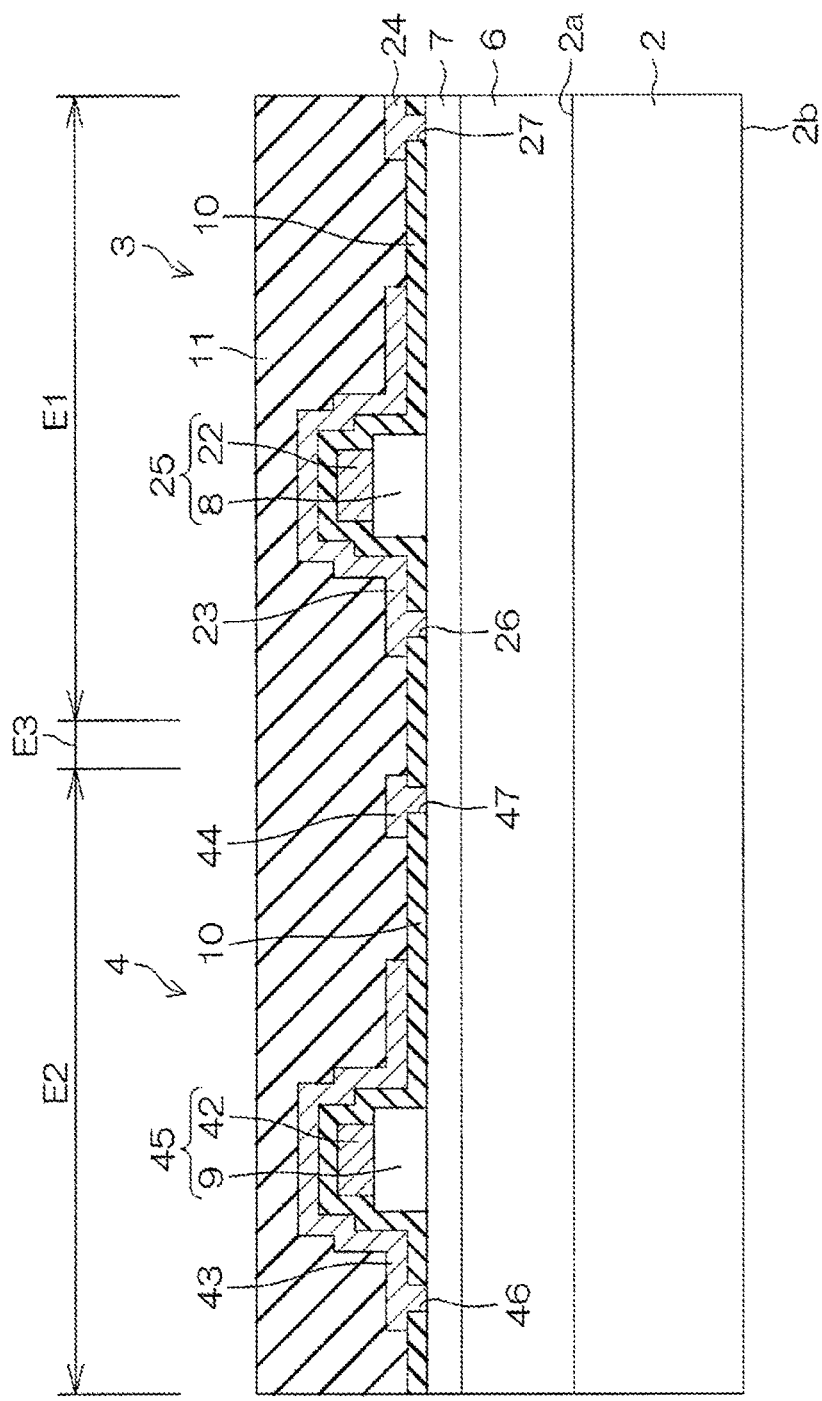
FIG. 3H is a cross-sectional diagram of a next step of FIG. 3G.

Then, as shown in FIG. 3H, the interlayer insulating layer 11 is formed in a manner of covering the entire exposed surface. The interlayer insulating layer 11 is made of, for example, an $SiO_2$ layer.

Figure 3I:
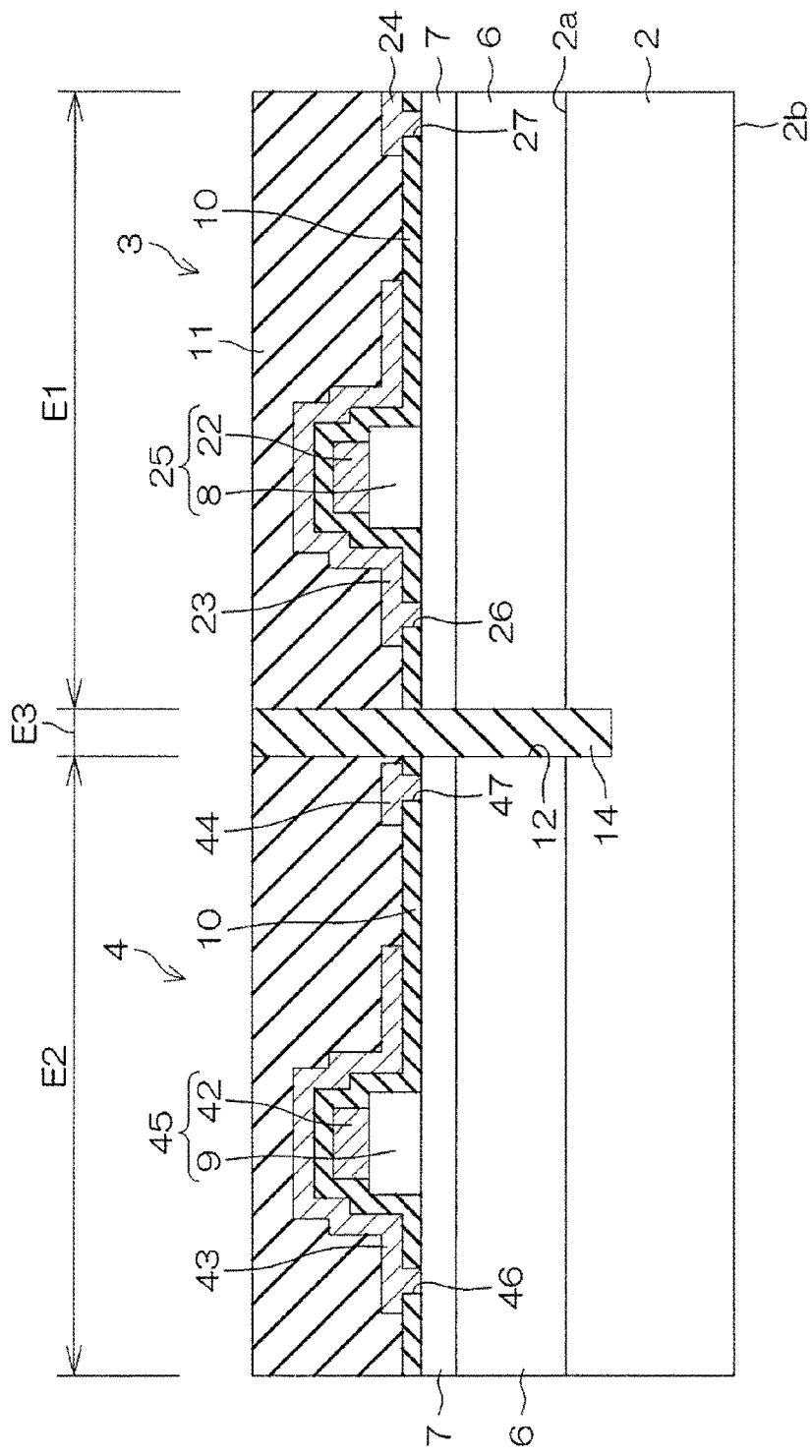
FIG. 3I is a cross-sectional diagram of a next step of FIG. 3H.

Then, as shown in FIG. 3I, the upper-side separation trench (trench) 12 is formed at the interlayer insulating layer 11, the passivation layer 10, the electron supply layer 7, the electron transport layer 6 and the substrate 2 in the separation region E3 by lithography and etching, wherein the upper-side separation trench 12 starts from the surface of the interlayer insulating layer 11 and reaches the inner of the substrate 2. Furthermore, the upper-side insulator 14 is embedded in the upper-side separation trench 12. The upper-side insulator 14 includes, for example, $SiO_2$.

Figure 3J:
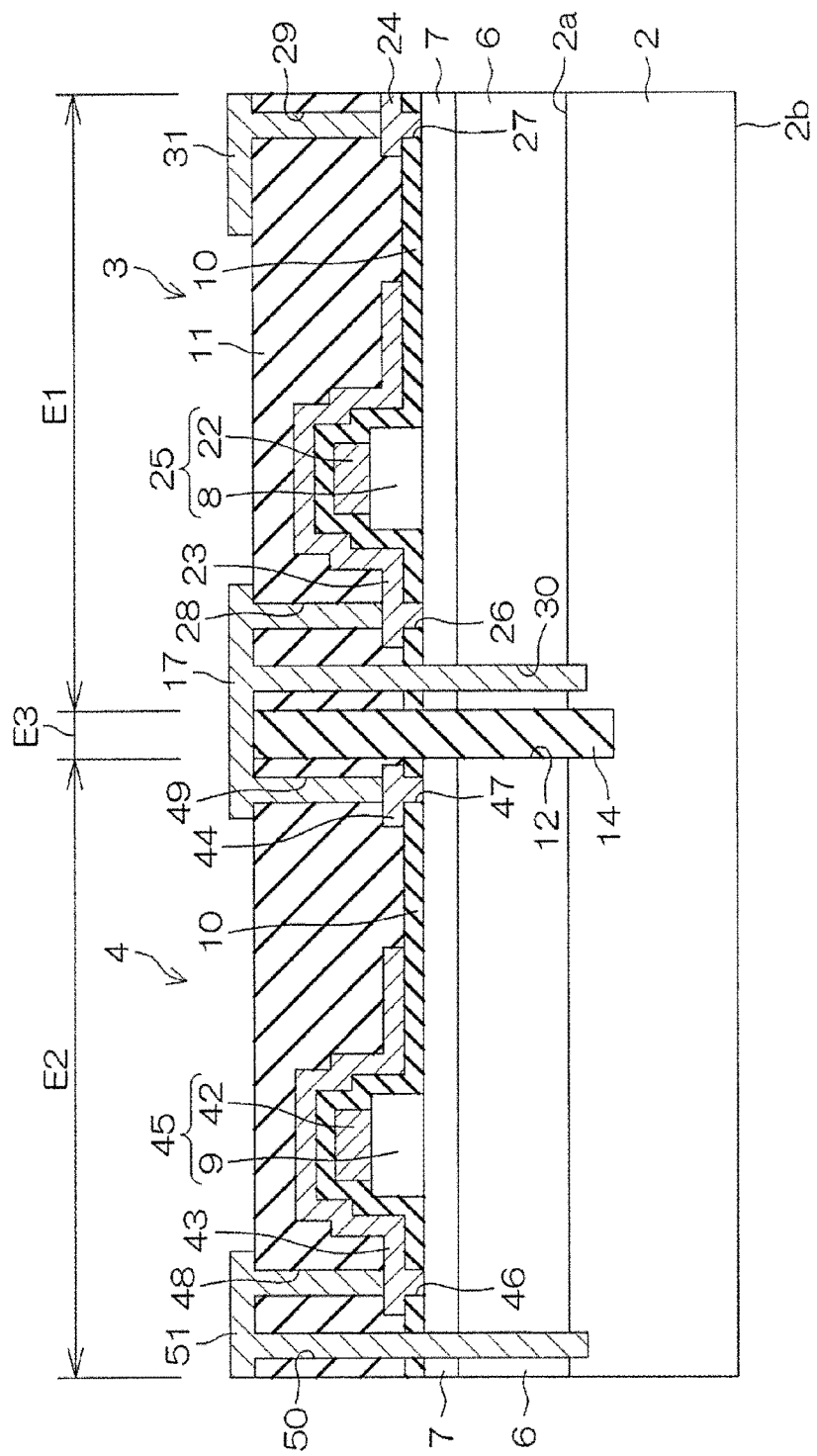
FIG. 3J is a cross-sectional diagram of a next step of FIG. 3I.

Then, as shown in FIG. 3J, in the first region E1, the first drain via hole 28 and the first drain via hole 29 are formed at the interlayer insulating layer 11 by lithography and etching. Furthermore, in the first region E1, the first source/substrate connecting via hole 30 is formed at the interlayer insulating layer 11, the passivation layer 10, the electron supply layer 7, the electron transport layer 6 and the substrate 2 by lithography and etching, wherein the first source/substrate connecting via hole 30 starts from the surface of the interlayer insulating layer 11 and reaches the inner of the substrate 2.

Furthermore, in the second region E2, the second source via hole 48 and the second drain via hole 49 are formed at the interlayer insulating layer 11 by lithography and etching. In addition, in the second region E2, the second source/substrate connecting via hole 50 is formed at the interlayer insulating layer 11, the passivation layer 10, the electron supply layer 7, the electron transport layer 6 and the substrate 2 by lithography and etching, wherein the second source/substrate connecting via hole 50 starts from the surface of the interlayer insulating layer 11 and reaches the inner of the substrate 2.

Then, a wire layer is formed on the interlayer insulating layer 11 by, for example, sputtering. Accordingly, the wire layer is embedded in the first source via hole 28, the first drain via hole 29, the first source/substrate connecting via hole 30, the second source via hole 48, the second drain via hole 49 and the second source/substrate connecting via hole 50, and the wire layer is formed on the interlayer insulating layer 11. The wire layer is made of, for example, an Al layer.

Then, the wire layer on the interlayer insulating layer 11 is patterned by lithography and etching. Accordingly, in the first region E1, the drain wire 31 connected to the first drain electrode 24 is formed on the interlayer insulating layer 11. Furthermore, in the first region E1, the separation region E3 and the second region E2, the inter-component connecting wire 17 connected to the first source electrode 23, a portion corresponding to the first region E1 on the substrate 2, and the second drain electrode 44 is formed on the interlayer insulating layer 11. Furthermore, in the second region E2, the source wire 51 connected to the second source electrode 43 and a portion corresponding to the second region E2 on the substrate 2 is formed on the interlayer insulating layer 11.

Figure 3K:
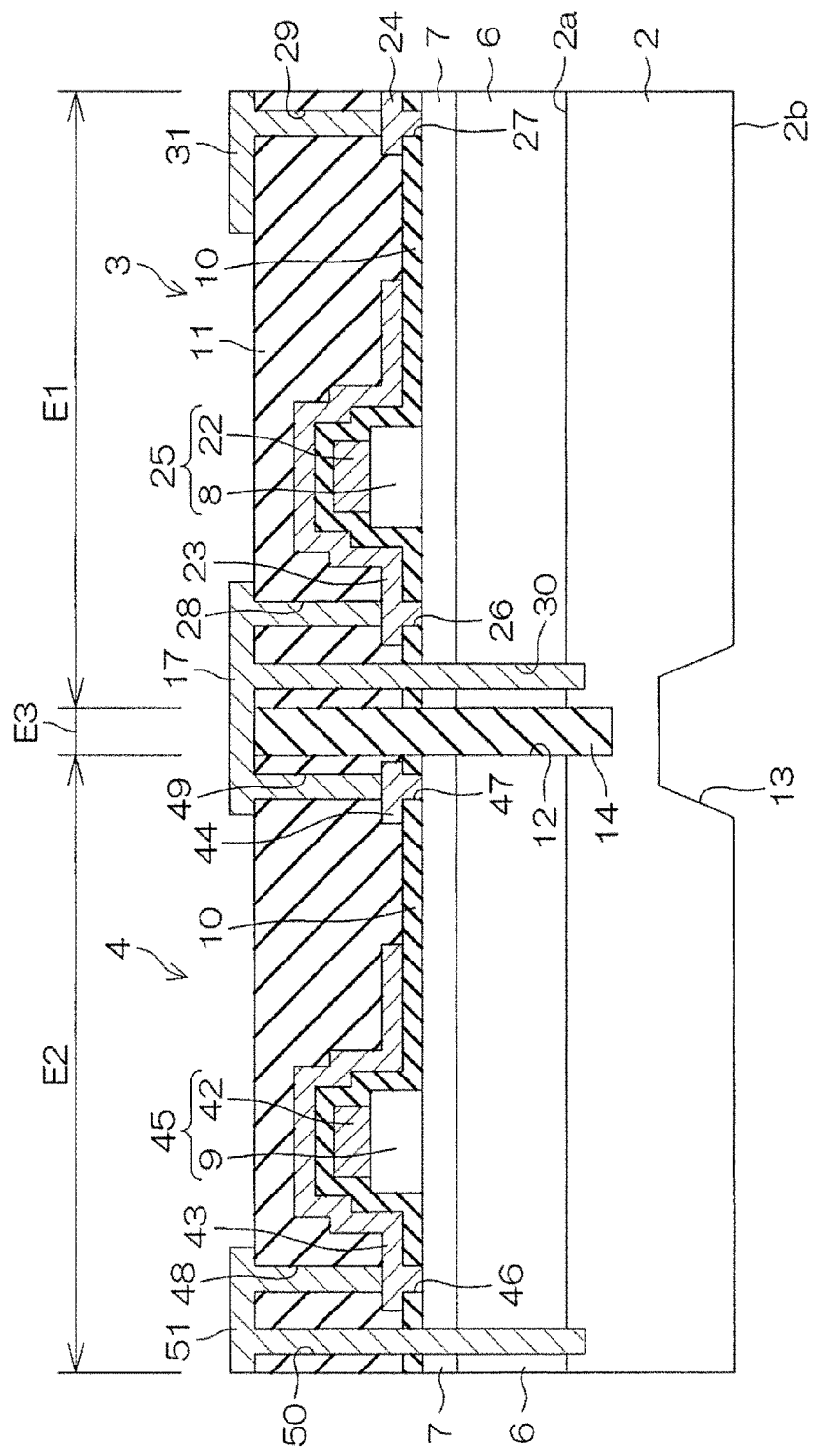
FIG. 3K is a cross-sectional diagram of a next step of FIG. 3J.

Then, as shown in FIG. 3K, in the separation region E3, the lower-side separation trench (trench) 13 is formed by lithography and etching, wherein the lower-side separation trench 13 is excavated from the second surface 2*b* toward the first surface 2*a* of the substrate 2 and yet spaced from the bottom surface of the upper-side separation trench 12.

Figure 3L:
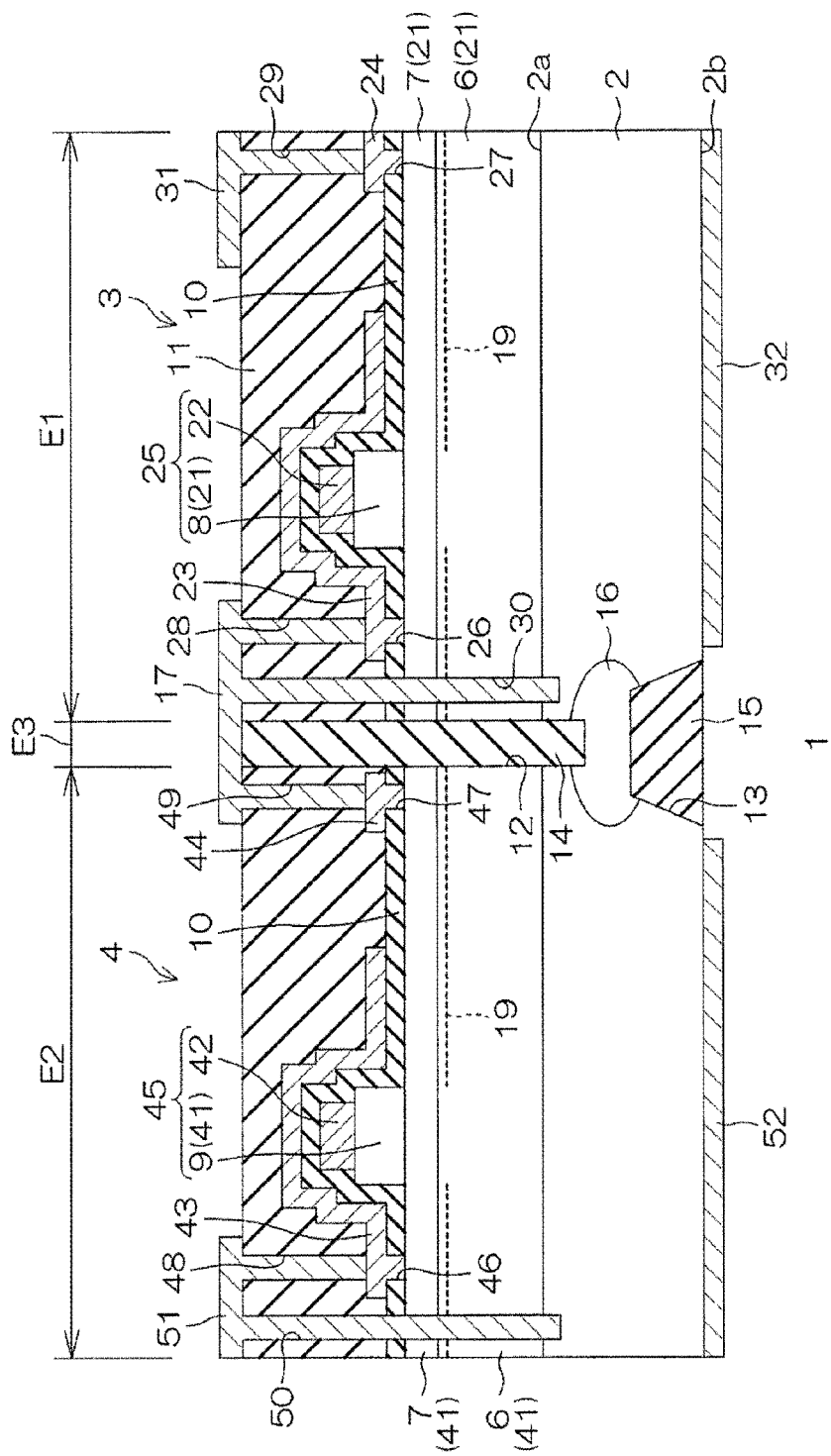
FIG. 3L is a cross-sectional diagram of a next step of FIG. 3K.

Then, as shown in FIG. 3L, the insulative region 16 is formed by a region including a portion between the upper-side separation trench 12 and the lower-side separation trench 13 in the substrate 2. The insulative region 16 may be, for example, formed by thermal oxidation of a portion of a bottom wall of the lower-side separation trench 13.

Lastly, in the first region E1, the first backside electrode 32 is formed on the second surface 2b of the substrate 2, and in the second region E2, the second backside electrode 52 is formed on the second surface 2b of the substrate 2. Thus, the nitride semiconductor device 1 having the configuration shown in FIG. 1 is obtained.

In the nitride semiconductor device 1 of the first embodiment, in the first region E1, the first source electrode 23 of the first transistor 3 is connected to the substrate 2, and in the second region E2, the second source electrode 43 of the second transistor 4 is connected to the substrate 2. Moreover, a portion corresponding to the first region E1 on the substrate 2 is insulated from a portion corresponding to the second region E2 on the substrate 2 by the first insulating regions 12, 13, 14, 15 and 16.

Accordingly, the substrate potential of the first transistor 3 serving as a high-side HEMT is consistent with the source potential of the first transistor 3, hence suppressing changes in current collapse characteristics. Accordingly, a nitride semiconductor device capable of forming a half-bridge structure and suppressing changes in current collapse characteristics may be realized.

In the nitride semiconductor device 1 of the first embodiment, a laminate layer of the electron transport layer 6 and the electron supply layer 7 in the first region E1 is insulated from a laminate layer of the electron transport layer 6 and the electron support layer 7 in the second region E2 by the second insulating regions 12 and 14. Accordingly, electrical characteristics of the two transistors 3 and 4 are made to be consistent.

Figure 4:
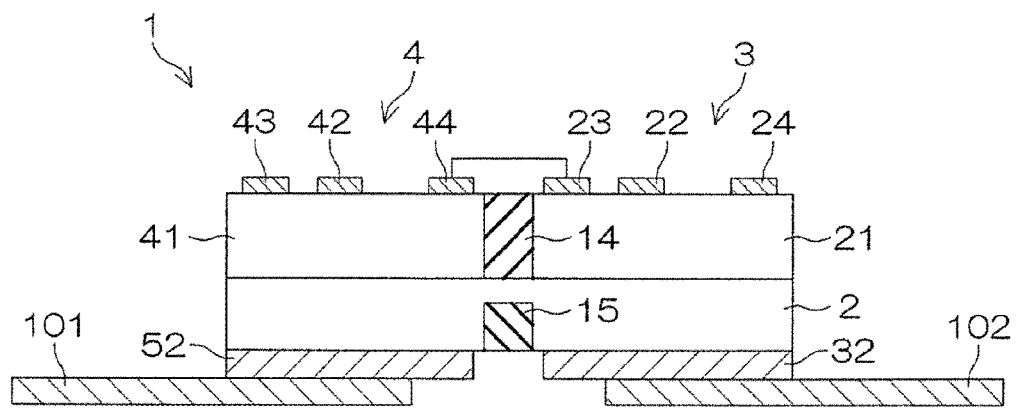
FIG. 4 is a cross-sectional diagram of an example of mounting the nitride semiconductor device in FIG. 1 on a package using lead frames.

FIG. 4 shows a cross-sectional diagram of an example of mounting the nitride semiconductor device 1 on a package using lead frames. In FIG. 4, the nitride semiconductor device 1 is simply depicted.

The nitride semiconductor device 1 is configured on a pair of left and right lead frames 101 and 102 by a state of crossing the pair of left and right lead frames 101 and 102. A region facing the left lead frame 101 in a lower surface of the second backside electrode 52 of the nitride semiconductor device 1 is bonded to an upper surface of the left lead frame 101 by solder (not shown). A region facing the right lead frame 102 in a lower surface of the first backside electrode 32 of the nitride semiconductor device 1 is bonded to an upper surface of the right lead frame 102 by solder (not shown).

Figure 5:
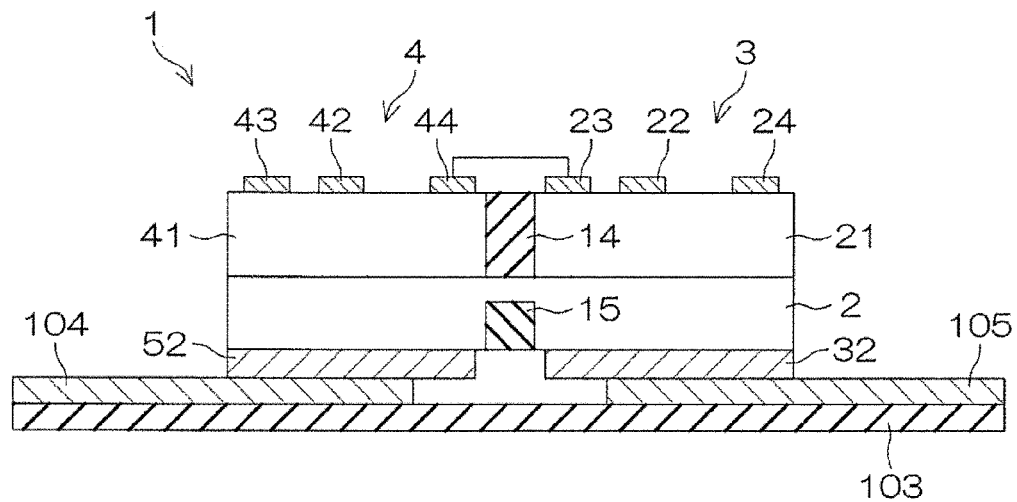
FIG. 5 is a cross-sectional diagram of an example of mounting the nitride semiconductor device in FIG. 1 on a package using an insulating support substrate.

FIG. 5 shows a cross-sectional diagram of an example of mounting the nitride semiconductor device 1 on a package using an insulating support substrate. In FIG. 5, the nitride semiconductor device 1 is simply depicted.

An insulating support substrate 103 includes a PCB (printed circuit board) substrate, a ceramic substrate and so on. A low-side conductor layer 104 is formed on the left of a surface of the insulating support substrate 103, and a high-side conductor layer 105 is formed on the right of the surface of the insulating support substrate 103. The nitride semiconductor device 1 is configured on the low-side conductor layer 104 and the high-side conductor layer 105 by a state of crossing the low-side conductor layer 104 and the high-side conductor layer 105. A region facing the low-side conductor layer 104 in the lower surface of the second backside electrode 52 of the nitride semiconductor device 1 is bonded to a surface of the low-side conductor layer 104 by solder (not shown). A region facing the high-side conductor layer 105 in the lower surface of the first backside electrode 32 of the nitride semiconductor device 1 is bonded to a surface of the high-side conductor layer 105 by solder (not shown).

Figure 6:
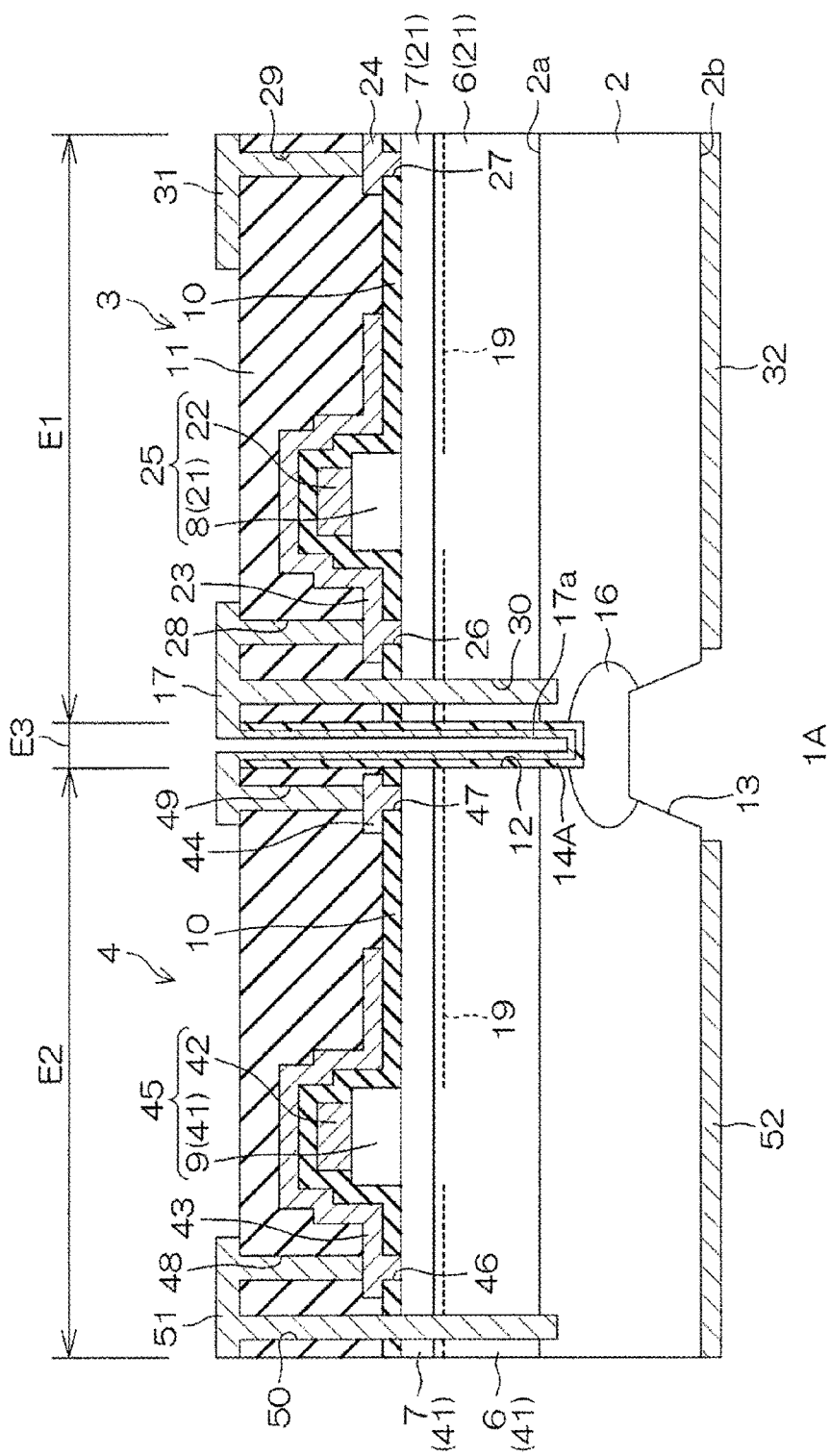
FIG. 6 is a cross-sectional diagram of a configuration of a nitride semiconductor device according to a second embodiment of the present invention.

FIG. 6 shows a cross-sectional diagram of a configuration of a nitride semiconductor device according to a second embodiment of the present invention. In FIG. 6, parts corresponding to those in FIG. 1 are represented by the same denotations.

In a nitride semiconductor device 1A of the second embodiment, an upper-side insulating film 14A is formed on a side surface and a bottom surface of the upper-side separation trench 12, instead of embedding the upper-side insulator 14 in the entire internal space of the upper-side separation trench 12. Furthermore, a wiring film 17a constitutes a part of the inter-component connecting wire 17 is also formed on the side surface and the bottom surface of the upper-side insulating film 14A in the upper-side separation trench 12. However, a space (gap) is formed in the wiring film 17a formed on a side surface facing the upper-side insulating film 14A in the upper-side separation trench 12.

Furthermore, in the nitride semiconductor device 1A of the second embodiment, the lower-side insulator 15 is not embedded in the lower-side separation trench 13.

In the second embodiment, a portion of the upper-side separation trench 12 formed at the substrate 2, the upper-side insulating film 14A formed in the portion, the lower-side separation trench 13 and the insulative region 16 constitute the "first insulating region" of the present invention. Furthermore, a portion of the upper-side separation trench 12 formed at the electron supply layer 7 and the electron transport layer 6, and the upper-side insulating film 14A formed in the portion constitute the "second insulating region" of the present invention.

Figure 7:
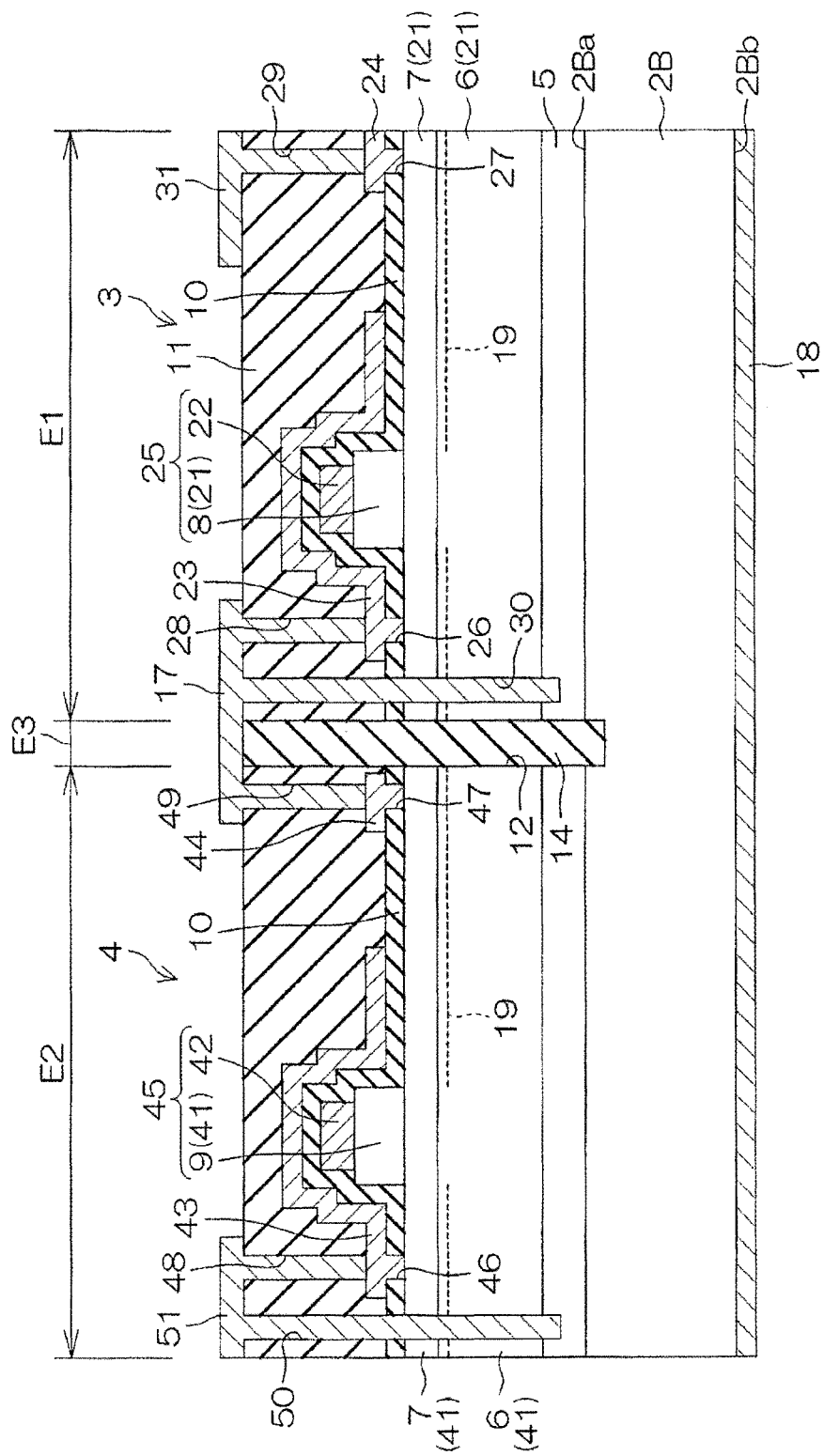
FIG. 7 is a cross-sectional diagram of a configuration of a nitride semiconductor device according to a third embodiment of the present invention.

FIG. 7 shows a cross-sectional diagram of a configuration of a nitride semiconductor device according to a third embodiment of the present invention. In FIG. 7, parts corresponding to those in FIG. 1 are represented by the same denotations.

In a nitride semiconductor device 1B of the third embodiment, an insulating substrate 2B is used as the substrate 2. The insulating substrate 2B includes a first surface 2Ba and a second surface 2Bb. A seed layer 5 is formed on the first surface 2Ba of the insulating substrate 2B. The seed layer 5 is made of a Si layer. The seed layer 5 is formed to allow the nitride semiconductor layer to extend outward and grow on the insulating substrate 2B. A substrate material including the insulating substrate 2B and the seed layer 5 thereon may be implemented by a substrate material of a technology referred to as QST (Quora substrate technology).

In the nitride semiconductor device 1B of the third embodiment, the electron transport layer 6 is formed on the seed layer 5. In the nitride semiconductor device 1B of the third embodiment, because the insulating substrate 2B is used, the lower-side separation trench 13 and the insulative region 16 in the nitride semiconductor device 1 in FIG. 1 are not formed. Furthermore, a backside electrode 18 in common with the first transistor 3 and the second transistor 4 is formed on a substantially full range of the second surface 2Bb of the insulating substrate 2.

In the nitride semiconductor device 1B of the third embodiment, because the insulating substrate 2B is used, the upper-side separation trench 12 need not be provided inside the insulating substrate 2B. However, in the third embodiment, a lower end portion of the upper-side separation trench 12 passes through the seed layer 5 and reaches the inner of the insulating substrate 2B.

Furthermore, in the nitride semiconductor device 1B of the third embodiment, because the insulating substrate 2B is used, the first source electrode 23 and the second source electrode 43 are not required to be connected to the insulating substrate 2B. Therefore, in the third embodiment, lower end portions of the first source/substrate connecting via hole 30 and the second source/substrate connecting via hole 50 reach the inner of the seed layer 5 but do not pass through the seed layer 5. That is to say, the lower ends of the first source/substrate connecting via hole 30 and the second source/substrate connecting via hole 50 do not reach the insulating substrate 2B.

In the nitride semiconductor device 1B of the third embodiment, a portion corresponding to the separation region E3 in the insulating substrate 2B is equivalent to the "first insulating region" of the present invention.

Furthermore, a semi-insulating substrate may also be used in substitution for the insulating substrate 2B.

Figure 8:
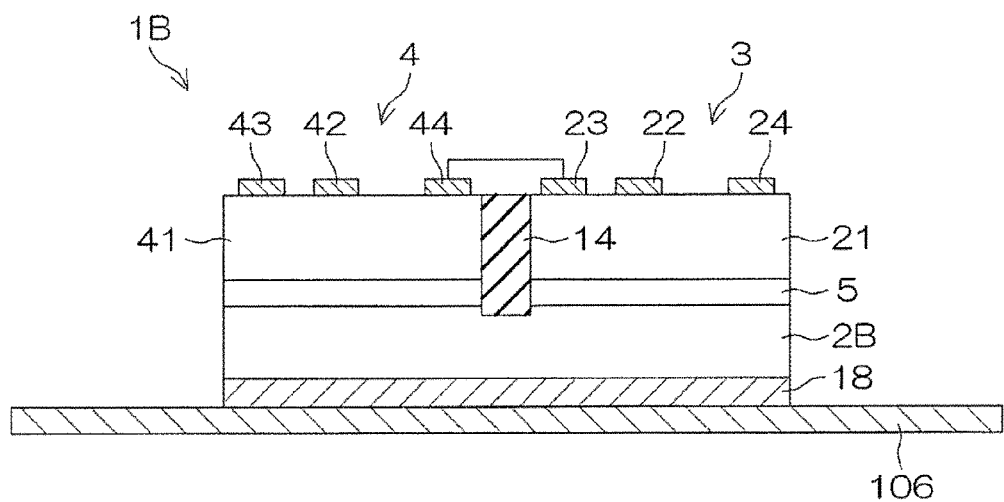
FIG. 8 is a cross-sectional diagram of an example of mounting the nitride semiconductor device in FIG. 7 on a package using a lead frame.

FIG. 8 shows a cross-sectional diagram of an example of mounting the nitride semiconductor device 1B on a package using a lead frame. In FIG. 8, the nitride semiconductor device 1B is simply depicted.

The nitride semiconductor device 1B is configured on a lead frame 106. A region facing the lead frame 106 in a lower surface of the backside electrode 18 of the nitride semiconductor device 1B is bonded to an upper surface of the lead frame 106 by solder (not shown).

Figure 9:
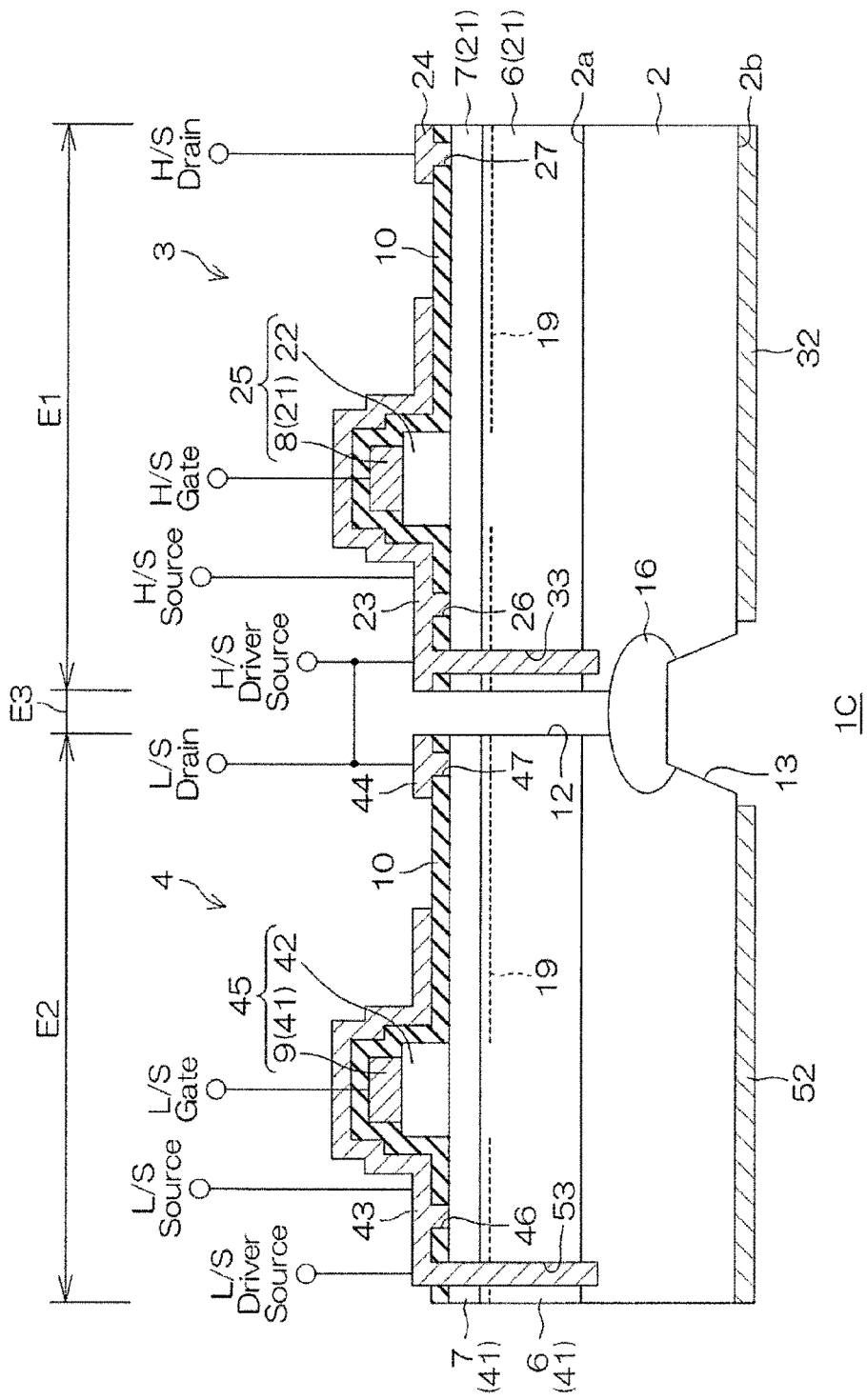
FIG. 9 is a cross-sectional diagram of a configuration of a nitride semiconductor device according to a fourth embodiment of the present invention.

FIG. 9 is a cross-sectional diagram of a configuration of a nitride semiconductor device according to a fourth embodiment of the present invention. In FIG. 9, parts corresponding to those in FIG. 1 are represented by the same denotations.

In a nitride semiconductor device 1C of the fourth embodiment, insulators are not embedded in the upper-side separation trench 12 or the lower-side separation trench 13.

In the first region E1, a first source/substrate connecting contact hole 33 is formed at the passivation layer 10, the electron supply layer 7, the electron transport layer 6 and the substrate 2, wherein the first source/substrate connecting contact hole 33 passes through the passivation layer 10, the electron supply layer 7 and the electron transport layer 6 and reaches the inner of the substrate 2. The first source electrode 23 is also formed at a portion between the first source contact hole 26 and the first source/substrate connecting contact hole 33 on the surface of the passivation layer 10. Furthermore, the first source electrode 23 passes through the first source/substrate connecting contact hole 33 and is thus in contact with the substrate 2.

In the second region E2, a second source/substrate connecting contact hole 53 is formed at the passivation layer 10, the electron supply layer 7, the electron transport layer 6 and the substrate 2, wherein the second source/substrate connecting contact hole 53 passes through the passivation layer 10, the electron supply layer 7 and the electron transport layer 6 and reaches the inner of the substrate 2. The second source electrode 43 is also formed at a portion between the second source contact hole 46 and the second source/substrate connecting contact hole 53 on the surface of the passivation layer 10. Furthermore, the second source electrode 43 passes through the second source/substrate connecting contact hole 53 and is thus in contact with the substrate 2.

The first drain electrode 24 is connected to a high-side (H/S) drain. The high-side drain is equivalent to the first power terminal P in FIG. 2. The first source electrode 23 is connected to a high-side (H/S) source and a high-side (H/S) driver source. The first gate electrode 22 is connected to a high-side (H/S) gate.

The second drain electrode 44 is connected to a low-side (L/S) drain. The first source electrode 23 and the second drain electrode 44 are connected by an external wire such as a bonding wire. The high-side source or the low-side drain serves as the output terminal Out in FIG. 2.

The second source electrode 43 is connected to a low-side (L/S) source and a low-side (L/S) driver source. The low-side (L/S) source is equivalent to the second power terminal N. The second gate electrode 42 is connected to a low-side (L/S) gate.

In the fourth embodiment, a portion of the upper-side separation trench 12 formed in the substrate 2, the lower-side separation trench 13 and the insulative region 16 constitute the "first insulating region" of the present invention. Furthermore, a portion of the upper-side separation trench 12 formed at the electron supply layer 7 and the electron transport layer 6 constitutes the "second insulating region" of the present invention.

Figure 10:
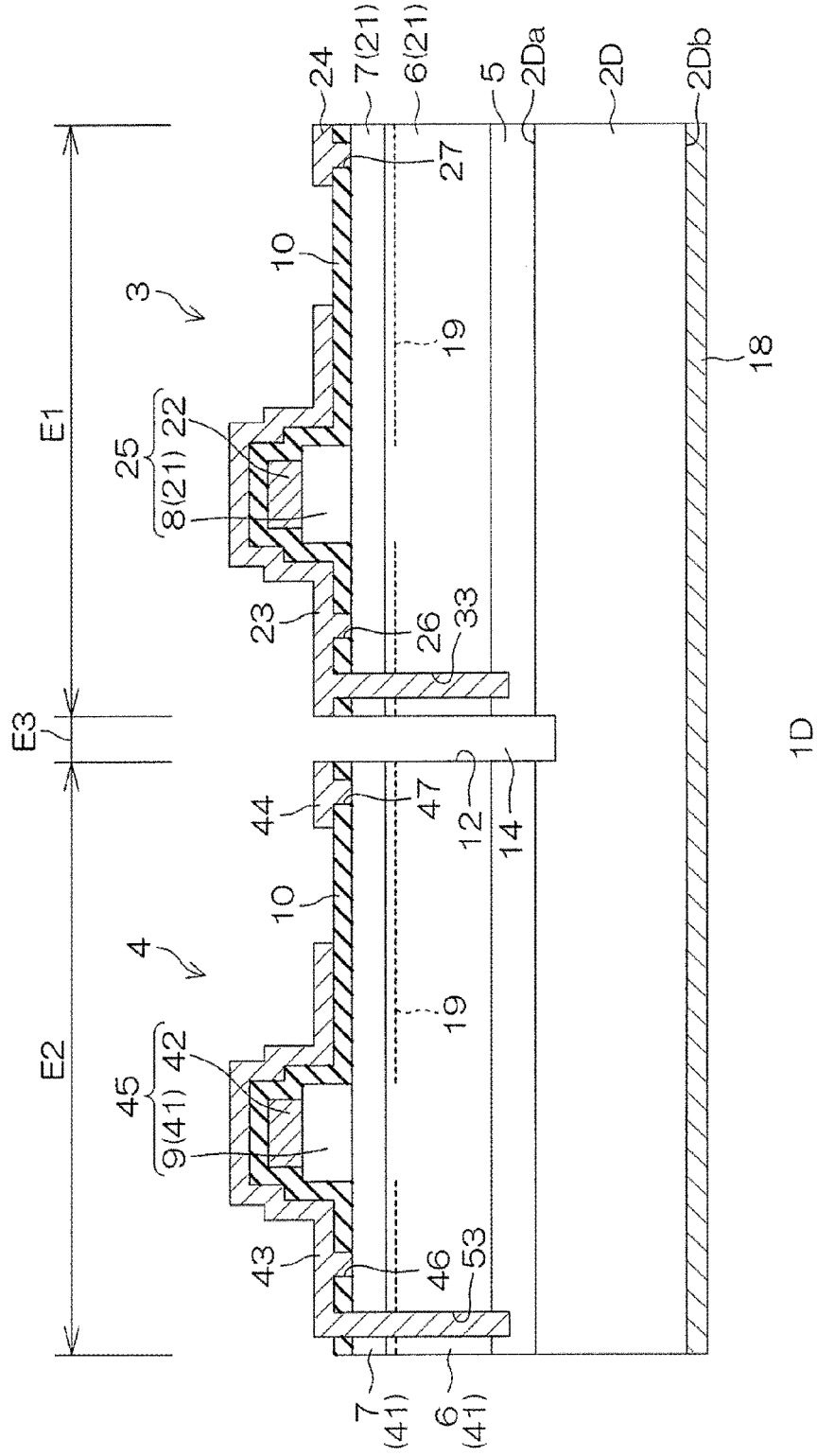
FIG. 10 is a cross-sectional diagram of a configuration of a nitride semiconductor device according to a fifth embodiment of the present invention.

FIG. 10 is a cross-sectional diagram of a configuration of a nitride semiconductor device according to a fifth embodiment of the present invention.

A nitride semiconductor device 1D of the fifth embodiment is similar to the nitride semiconductor device 1C in FIG. 9. In FIG. 10, parts corresponding to those in FIG. 9 are represented by the same denotations.

In the nitride semiconductor device 1D of the fifth embodiment, an insulating substrate 2D is used as the substrate 2. The insulating substrate 2D includes a first surface 2Da and a second surface 2Db. A seed layer 5 is formed on the first surface 2Da of the insulating substrate 2D. The seed layer 5 is made of a Si layer. The seed layer 5 is formed for the nitride semiconductor layer to extend outward and grow on the insulating substrate 2D. A substrate material including the insulating substrate 2D and the seed layer 5 thereon may be implemented by a substrate material of a technology referred to as the QST (Qromis substrate technology). A process for an insulating substrate performed from a backside is not required if such insulating substrate 2D is used, and hence the required structure may be more readily achieved.

In the nitride semiconductor device 1D of the fifth embodiment, the electron transport layer 6 is formed on the seed layer 5. In the nitride semiconductor device 1D of the fifth embodiment, because the insulating substrate 2D is used, the lower-side separation trench 13 and the insulative region 16 in the nitride semiconductor device 1C in FIG. 9 are not formed. Furthermore, a backside electrode 18 in common with the first transistor 3 and the second transistor 4 is formed on a substantially entire range of the second surface 2Db of the insulating substrate 2D.

In the nitride semiconductor device 1D of the fifth embodiment, because the insulating substrate 2D is used, the upper-side separation trench 12 need not be provided inside the insulating substrate 2D. However, in the fifth embodiment, a lower end portion of the upper-side separation trench 12 passes through the seed layer 5 and reaches the inner of the insulating substrate 2D.

Furthermore, in the nitride semiconductor device 1D of the fifth embodiment, because the insulating substrate 2D is used, the first source electrode 23 and the second source electrode 43 are not required to be connected to the insulating substrate 2D. Therefore, in the fifth embodiment, lower end portions of the first source/substrate connecting contact hole 33 and the second source/substrate connecting contact hole 53 reach the inner of the seed layer 5 but do not pass through the seed layer 5. That is to say, the lower ends of the first source/substrate connecting contact hole 33 and the second source/substrate connecting contact hole 53 do not reach the insulating substrate 2D.

In the nitride semiconductor device 1D of the fifth embodiment, a portion corresponding to the separation region E3 in the insulating substrate 2D is equivalent to the "first insulating region" of the present invention.

Furthermore, a semi-insulating substrate may also be used in substitution for the insulating substrate 2D.

The first to fifth embodiments of the present invention are described above. However, the present invention may also be implemented by other embodiments.

For example, in the nitride semiconductor devices 1, 1A and 1C in FIG. 1, FIG. 5 and FIG. 6, the interlayer insulating layer 11 is provided as one in quantity; however, the interlayer insulating layer may also be provided as two more interlayer insulating layers. In this case, the upper-side separation trench 12, the first source via hole 28, the first drain via hole 29, the first source/substrate connecting via hole 30, the second source via hole 48, the second drain via hole 49 and the second source/substrate connecting via hole 50 may also be formed as starting from a surface of the interlayer insulating layer at the uppermost layer.

Furthermore, in the manufacturing method for the nitride semiconductor device 1 shown in FIG. 3A to FIG. 3L, after forming the upper-side separation trench 12, the first source via hole 28, the first drain via hole 29, the first source/substrate connecting via hole 30, the second source via hole 48, the second drain via hole 49 and the second source/substrate connecting via hole 50 are formed. However, the upper-side separation trench 12 may also be formed after forming the first source via hole 28, the first drain via hole 29, the first source/substrate connecting via hole 30, the second source via hole 48, the second drain via hole 49 and the second source/substrate connecting via hole 50.

In the nitride semiconductor device 1 in FIG. 1, the lower-side insulator 15 is embedded in the lower-side separation trench 13; however, the lower-side insulator 15 may also be not embedded in the lower-side separation trench 13.

In addition, various design changes may be implemented within the scope of the matters stated in the appended claims.

What is claimed is:

1. A nitride semiconductor device, comprising:
   a substrate, comprising a first surface and a second surface;
   a first lateral transistor, formed in a first region on the first surface of the substrate; and
   a second lateral transistor, formed in a second region on the first surface of the substrate;
   wherein, the first lateral transistor comprises:
      a first nitride semiconductor layer, formed on the substrate; and
      a first gate electrode, a first source electrode and a first drain electrode, formed on the first nitride semiconductor layer;
   the second lateral transistor comprises:
      a second nitride semiconductor layer, formed on the substrate; and
      a second gate electrode, a second source electrode and a second drain electrode, formed on the second nitride semiconductor layer;
   wherein, the first source electrode is electrically connected to a lower region of the first region on the substrate, the second source electrode is electrically connected to a lower region of the second region on the substrate, and a first insulating region is disposed between a portion corresponding to the first region on the substrate and a portion corresponding to the second region on the substrate,
   wherein the first insulating region comprises:
      a first separation trench extending from the first surface toward the second surface of the substrate;
      a second separation trench between the first region and the second region, wherein the second separation trench extends from the second surface toward the first surface of the substrate, the second separation trench includes at least one sidewall directly connected to the second surface, and the second separation trench has a top surface proximal to a bottom surface of the first separation trench; and
      a non-semiconductor insulator material between the bottom surface of the first separation trench and the top surface of the second separation trench, wherein the second separation trench stops at the non-semiconductor insulator material.

2. The nitride semiconductor device according to claim 1, wherein the first separation trench comprises a first insulator; and the second separation trench comprises a second insulator.

3. The nitride semiconductor device according to claim 1, wherein the first nitride semiconductor layer and the second nitride semiconductor layer are insulated by a second insulating region formed therebetween.

4. The nitride semiconductor device according to claim 2, wherein the first nitride semiconductor layer and the second nitride semiconductor layer are insulated by a second insulating region formed therebetween.

5. The nitride semiconductor device according to claim 3, wherein the second insulating region comprises a third separation trench, and the third separation trench is formed in a region between the first nitride semiconductor layer and the second nitride semiconductor layer.

6. The nitride semiconductor device according to claim 5, wherein the second insulating region further comprises a third insulator, and the third insulator is embedded in the third separation trench.

7. The nitride semiconductor device according to claim 1, wherein the first nitride semiconductor layer comprises:
   an electron transport layer over the substrate, wherein the electron transport layer comprises the first nitride semiconductor;
   an electron supply layer over the electron transport layer, wherein the electron supply layer comprises the second nitride semiconductor having a band gap larger than that of the first nitride semiconductor of the electron transport layer; and
   a semiconductor gate layer, configured on a portion of the surface of the electron supply layer, comprising a third nitride semiconductor having an acceptor impurity.

8. The nitride semiconductor device according to claim 1, wherein the first source electrode and the first drain electrode are formed on the electron supply layer of the first nitride semiconductor layer, the first gate electrode is formed on a semiconductor gate layer on the first nitride semiconductor layer.

9. The nitride semiconductor device according to claim 1, wherein the second nitride semiconductor layer comprises:
   an electron transport layer over the substrate, wherein the electron transport layer comprises the first nitride semiconductor;

an electron supply layer over the electron transport layer, wherein the electron supply layer comprises the second nitride semiconductor having a band gap larger than that of the first nitride semiconductor of the electron transport layer; and a semiconductor gate layer, configured on a portion of the surface of the electron supply layer, comprising a third nitride semiconductor having an acceptor impurity.

10. The nitride semiconductor device according to claim 9, wherein the second source electrode and the second drain electrode are formed on the electron supply layer of the second nitride semiconductor layer, and the second gate electrode is formed on the semiconductor gate layer of the second nitride semiconductor layer.

11. The nitride semiconductor device according to claim 1, wherein the first lateral transistor comprises a first driver source electrode formed on a surface side of the first nitride semiconductor layer, and the second lateral transistor comprises a second driver source electrode formed on a surface side of the second nitride semiconductor layer.

12. The nitride semiconductor device according to claim 2, wherein the first lateral transistor comprises a first driver source electrode formed on a surface side of the first nitride semiconductor layer, and the second lateral transistor comprises a second driver source electrode formed on a surface side of the second nitride semiconductor layer.

13. The nitride semiconductor device according to claim 3, wherein the first lateral transistor comprises a first driver source electrode formed on a surface side of the first nitride semiconductor layer, and the second lateral transistor comprises a second driver source electrode formed on a surface side of the second nitride semiconductor layer.

14. A nitride semiconductor device, comprising:
a substrate, comprising a first surface and a second surface;
a first lateral transistor, formed in a first region on the first surface of the substrate; and
a second lateral transistor, formed in a second region on the first surface of the substrate;
wherein, the first lateral transistor comprises:
  a first nitride semiconductor layer, formed on the substrate; and
  a first gate electrode, a first source electrode and a first drain electrode, formed on the first nitride semiconductor layer;
the second lateral transistor comprises:
  a second nitride semiconductor layer, formed on the substrate; and
  a second gate electrode, a second source electrode and a second drain electrode, formed on the second nitride semiconductor layer;
wherein, the first source electrode is electrically connected to a lower region of the first region on the substrate, the second source electrode is electrically connected to a lower region of the second region on the substrate, and a first insulating region is disposed between a portion corresponding to the first region on the substrate and a portion corresponding to the second region on the substrate;

a seed layer, extending from a position between the first nitride semiconductor layer and the substrate to a position between the second nitride semiconductor layer and the substrate;

a first separation trench in the first insulating region, configured to electrically isolate the portion corresponding to the first region and the portion corresponding to the second region, wherein the first separation trench penetrates the seed layer;

a second separation trench between the first region and the second region, wherein the second separation trench extends from the second surface toward the first surface of the substrate, the second separation trench includes at least one sidewall directly connected to the second surface, and the second separation trench has a top surface proximal to a bottom surface of the first separation trench;

a conductive via electrically connected to the first source electrode, wherein the conductive via stops at the seed layer and a non-semiconductor insulator material between the bottom surface of the first separation trench and the top surface of the second separation trench, wherein the second separation trench stops at the non-semiconductor insulator material.

15. The nitride semiconductor device according to claim 14, wherein the substrate is made of an insulating material or a semi-insulating material.

16. The nitride semiconductor device according to claim 14, wherein the conductive via is free from being in contact with the substrate.

17. The nitride semiconductor device according to claim 14, further comprising a backside electrode over the second surface of the substrate.

18. The nitride semiconductor device according to claim 14, wherein the first nitride semiconductor layer comprises:
an electron transport layer over the substrate, wherein the electron transport layer comprises the first nitride semiconductor; and
an electron supply layer over the electron transport layer, wherein the electron supply layer comprises the second nitride semiconductor having a band gap larger than that of the first nitride semiconductor of the electron transport layer.

19. The nitride semiconductor device according to claim 18, wherein a bottom surface of the first drain electrode is in direct contact with a top surface of the electron supply layer.

20. The nitride semiconductor device according to claim 14, wherein the seed layer is made of silicon.

* * * * *